(12) United States Patent
Britt et al.

(10) Patent No.: US 10,731,263 B2
(45) Date of Patent: Aug. 4, 2020

(54) METHOD AND DEVICE FOR CARRYING OUT A CHEMICAL REACTION

(71) Applicants: Edward J. Britt, Cupertino, CA (US); Reay S. Dick, Mountain View, CA (US); W. Todd Wipke, Santa Cruz, CA (US)

(72) Inventors: Edward J. Britt, Cupertino, CA (US); Reay S. Dick, Mountain View, CA (US); W. Todd Wipke, Santa Cruz, CA (US)

( * ) Notice: Subject to any disclaimer, the term of this patent is extended or adjusted under 35 U.S.C. 154(b) by 0 days.

(21) Appl. No.: 16/168,064

(22) Filed: Oct. 23, 2018

(65) Prior Publication Data

US 2019/0136391 A1    May 9, 2019

Related U.S. Application Data

(63) Continuation-in-part of application No. 14/855,365, filed on Sep. 15, 2015, now Pat. No. 10,109,812, which is a continuation-in-part of application No. PCT/US2014/030670, filed on Mar. 17, 2014.

(60) Provisional application No. 61/801,647, filed on Mar. 15, 2013.

(51) Int. Cl.
| | |
|---|---|
| *C25B 1/04* | (2006.01) |
| *C25B 1/00* | (2006.01) |
| *C25B 9/04* | (2006.01) |
| *B01J 19/12* | (2006.01) |
| *H01L 51/00* | (2006.01) |

(52) U.S. Cl.
CPC ............. *C25B 1/04* (2013.01); *C25B 1/003* (2013.01); *C25B 9/04* (2013.01); *B01J 19/12* (2013.01); *H01L 51/0056* (2013.01); *H01L 51/0078* (2013.01); *H01L 51/0093* (2013.01)

(58) Field of Classification Search
None
See application file for complete search history.

(56) References Cited

U.S. PATENT DOCUMENTS

| | | | | | |
|---|---|---|---|---|---|
| 4,197,142 | A * | 4/1980 | Bolton | ................... | B82Y 10/00 136/255 |
| 9,193,727 | B2 * | 11/2015 | Khokhlov | ............ | C07D 241/46 |
| 10,109,812 | B2 * | 10/2018 | Britt | ........................ | C25B 1/003 |
| 2002/0038860 | A1 * | 4/2002 | Tsuboyama | ............ | C09K 19/54 252/301.16 |
| 2003/0075216 | A1 * | 4/2003 | Loewe | ................... | B82Y 10/00 136/263 |
| 2010/0193011 | A1 * | 8/2010 | Mapel | ..................... | C03C 3/102 136/246 |

(Continued)

OTHER PUBLICATIONS

Phthalocyanine downloaded from URL<https://pubchem.ncbi.nlm.nih.gov/connpound/phthalocyanine> on Jun. 21, 2019. (Year: 2019).*

*Primary Examiner* — J. E. Schoenholtz

(57) ABSTRACT

A method and device for carrying out a chemical reaction, by supplying to the chemical reaction energy from an electron- and, optionally, photon-containing energy wave that is induced in one or more aggregated molecular ensembles, wherein the emission of which is stimulated from the ensembles. Emission is stimulated from the ensembles by a wide variety of energy inputs, and energy derived from this electron and/or photon energy wave is advantageously used as an energy source to assist chemical reduction reactions.

23 Claims, 19 Drawing Sheets

(56) References Cited

U.S. PATENT DOCUMENTS

2011/0308962 A1* 12/2011 Eckelberry ............. C25B 1/003
　　　　　　　　　　　　　　　　　　　205/340
2014/0373920 A1* 12/2014 Stein .................... H01G 9/2018
　　　　　　　　　　　　　　　　　　　136/263

* cited by examiner $E_k = E_0 - 2A\cos ka$ $ka = \frac{2m\pi}{N}$

N= Number of atoms in the ring (20)

m=Integer $-N/2 \leq m \leq N/2$

Then if L is Expressed in Angstrom Units:

$$E(eV) = 0.8 + 14.4\left[\frac{1}{L} + \frac{1}{L} + \frac{1}{L\sqrt{2}}\right]$$

and $$E(eV) = 0.8 + \frac{39}{L}$$

METHOD AND DEVICE FOR CARRYING OUT A CHEMICAL REACTION

CROSS-REFERENCE TO RELATED APPLICATIONS

The present application is a continuation-in-part application of application Ser. No. 14/855,365, filed Sep. 15, 2015, now allowed (U.S. Pat. No. 10,109,812), which is a continuation-in-part application of co-pending International Application No. PCT/US2014/030670, filed Mar. 17, 2014, which was published as WO2014-145838, on Sep. 18, 2014, and which claims the right of priority based on Provisional Application No. 61/801,647, filed Mar. 15, 2013. The entire contents of each earlier application, in their entirety, are hereby incorporated by reference into the present application.

BACKGROUND OF THE INVENTION

The present invention relates to a method and device that can serve as an energy source, for example, for carrying out a chemical reaction. More particularly the invention preferably relates to a method and device for supplying to a chemical reaction energy from an electron- and, optionally, photon-containing energy wave that is induced in one or more aggregated molecular ensembles, wherein the emission of which is stimulated from the ensembles. Stimulation can be accomplished by a wide variety of energy inputs and is preferably accomplished by photon energy, in one preferred aspect of the invention, by solar energy. The energy derived from this electron and/or photon energy wave is useful for providing energy that can be used for a large number of purposes, including: modulation of signals in circuits used for communication purposes (in the broadest sense), e.g., in optical fibers, electronic conductors or radio transmission systems; performing as an energy conversion device, e.g., as a photovoltaic energy converter; and preferably performing chemical reduction reactions, by themselves, or in favorably shifting or driving the energy equilibrium of other types of chemical reactions. The aggregated molecular ensembles themselves, although differing from a laser by virtue its production of, inter alia, a charge transfer rather than merely light, can be employed in virtually all of the same fields in which a laser is utilized, such as communications, data storage, etc.

The present invention involves carrying out a chemical reaction by supplying energy to one or more reactants by a mechanism or process denominated as Electron Polarization Wave Amplified by Stimulated Emission of Radiation(EPWASER is an acronym). The process, which results in the formation of an electron-containing energy wave in aggregated molecular ensembles, is summarized as follows, with respect to one type of suitable molecule, for example, but not limited to chlorophyll. A quantum mechanical model shows that in certain closely associated groups of molecules, like chlorophyll, light absorption can lead to electron transfer between adjacent molecules. This type of inter-molecular electron transfer will populate a metastable state such as the chlorophyll triplet state, which is normally spin-forbidden in isolated molecules. Successive photon induced electron transfers can thus create a localized population inversion. In the stimulated emission process, electrons return to the ground state of an adjacent molecule. This occurs because the decay of the triplet state is spin-forbidden within a given molecule. The EPWASER process results in the wave-like movement of electron-hole pairs (and optionally photons) which sum up or collate the energy stored in the entire molecule ensemble.

The energy charges produced by EPWASER action can be used in an endless number applications, including the participation in chemical reactions, such as water splitting, which require more energy than is available in a 1.8 eV photon (visible light). The EPWASER process mechanism represents, according to one embodiment of the invention, a practical approach to high efficiency solar-powered decomposition of water. The EPWASER effect can be produced not only in solid state, but also in vitro, and can serve as the basis for a practical solar energy converter, in general.

SUMMARY OF THE INVENTION

According to one preferred aspect of the present invention, there has been provided a method for carrying out a chemical reaction, comprising: conducting an endergonic chemical reaction; and supplying to the chemical reaction energy comprising an electron polarization wave produced by a process comprising:

(A) pumping energy into a bounded volume of excitable medium containing a fabricated and ordered ensemble of a material comprised of closely spaced molecules, wherein the ordered ensemble has (a) well defined energy states including a lower state, and one or more higher states above the lower state, and (b) a curve of electron binding energy levels versus a number of electrons added to one of the closely spaced molecules that is flat enough to enable an electron to be added to or subtracted from the molecule with a negligible change in total binding energy in the molecule; and (c) wherein the closely spaced molecules of the ring compound are arranged sufficiently close together to enable transfer of excited electrons between adjacent closely spaced molecules due to the property of the closely spaced molecules recited in (b), whereby an excited electron can be transferred between adjacent closely spaced molecules with a negligible change in binding energy, to form a longer-lived excited state because the excited electron is spin-forbidden to decay back to the lower state within the one of the closely spaced molecules to which it has moved, wherein energy is pumped in an amount that is sufficient to raise a plurality of electrons in the closely spaced molecules to the one or more higher energy states;

(B) releasing stored energy in the longer-lived excited state, by a transition process that includes a charge transfer jumping from the longer-lived excited state in one molecule to the lower state in the one of the adjacent closely spaced molecule, to thereby produce an electromagnetic oscillation; and (C) stimulating an output emission from the bounded volume of excitable medium by employing the electromagnetic oscillation to stimulate at least one additional successive transition of a second excited electron to release its energy of excitation by jumping to a neighboring molecule, thereby amplifying the electromagnetic oscillation with energy output, to thereby sum up a plurality of individual excitations adding to an amplitude of the stimulating electromagnetic oscillation, to create an output emission comprising the electron polarization wave that includes an energetically driven charge motion of electrons and/or holes.

In accordance with another preferred aspect of the invention, there is provided a device for carrying out a chemical reaction, comprising: a reactor for conducting an endergonic chemical reaction; and a device, for supplying to the chemical reaction, energy comprising an electron polarization wave produced by a process comprising:

(A) pumping energy into a bounded volume of excitable medium containing a fabricated and ordered ensemble of a material comprised of closely spaced molecules, wherein the ordered ensemble has (a) well defined energy states including a lower state, and one or more higher states above the lower state, and (b) a curve of electron binding energy levels versus a number of electrons added to one of the closely spaced molecules that is flat enough to enable an electron to be added to or subtracted from the molecule with a negligible change in total binding energy in the molecule; and (c) wherein the closely spaced molecules of the ring compound are arranged sufficiently close together to enable transfer of excited electrons between adjacent closely spaced molecules due to the property of the closely spaced molecules recited in (b), whereby an excited electron can be transferred between adjacent closely spaced molecules with a negligible change in binding energy, to form a longer-lived excited state because the excited electron is spin-forbidden to decay back to the lower state within the one of the closely spaced molecules to which it has moved, wherein energy is pumped in an amount that is sufficient to raise a plurality of electrons in the closely spaced molecules to the one or more higher energy states;

(B) releasing stored energy in the longer-lived excited state, by a transition process that includes a charge transfer jumping from the longer-lived excited state in one molecule to the lower state in the one of the adjacent closely spaced molecule, to thereby produce an electromagnetic oscillation; and (C) stimulating an output emission from the bounded volume of excitable medium by employing the electromagnetic oscillation to stimulate at least one additional successive transition of a second excited electron to release its energy of excitation by jumping to a neighboring molecule, thereby amplifying the electromagnetic oscillation with energy output, to thereby sum up a plurality of individual excitations adding to an amplitude of the stimulating electromagnetic oscillation, to create an output emission comprising the electron polarization wave that includes an energetically driven charge motion of electrons and/or holes.

According to another preferred aspect of the invention, the method or device uses, as the ordered ensemble of molecules, one comprising a ring compound, especially those based on ring compounds having atomic units that are a multiple of 4 and having conjugated double bonds in the ring. In preferred aspects, the ring compounds are based on a porphyrin ring, especially chlorophyll. In other preferred aspects of the invention, the ordered ensemble comprises a compound having chlorophyll-like rings of carbon atoms, coronene and similar rings that behave as a ring of six linked entities that can be excited into higher energy states, phthalocyanine and ruthenium tris bipyridine.

According to another preferred aspect of the invention, the ordered ensemble includes a layer having a thickness dimension and a longitudinal axis running transverse to the thickness dimension, and wherein the electron polarization wave moves in the direction of the longitudinal axis.

According to yet another preferred aspect of the invention, at least a portion of the output is generated within the device by amplifying the wave with energy output that adds coherently to the amplitude of the electromagnetic oscillation and adds energy to the moving electrons and/or holes.

In other preferred aspects of the invention, the method and/or device employs, as the molecular ensemble structure, a monolayer-type film of molecules deposited on a substrate, and in certain embodiments the film is deposited on substrate having metallic conducting strips embedded at intervals to collect electric currents. In other arrangements, the molecular (and/or atomic) ensemble structure is formed in a three-dimensional volume.

In other applications, the molecular ensemble structure comprises a plurality of molecular or atomic species, at least some of which function to bond to or at least interact with at least one chemical reactant. According to certain preferred aspects of the invention, the bonding and/or interacting species comprise at least one metallic species.

In certain preferred embodiments, the released energy from the stored energy also produces light, most preferably coherent light.

Further features of the invention will become apparent from the detailed description of preferred embodiments that follows, when considered together with the accompanying figures of drawing.

BRIEF DESCRIPTION OF DRAWING FIGURES

DETAILED DESCRIPTION OF PREFERRED EMBODIMENTS

Figure 1:
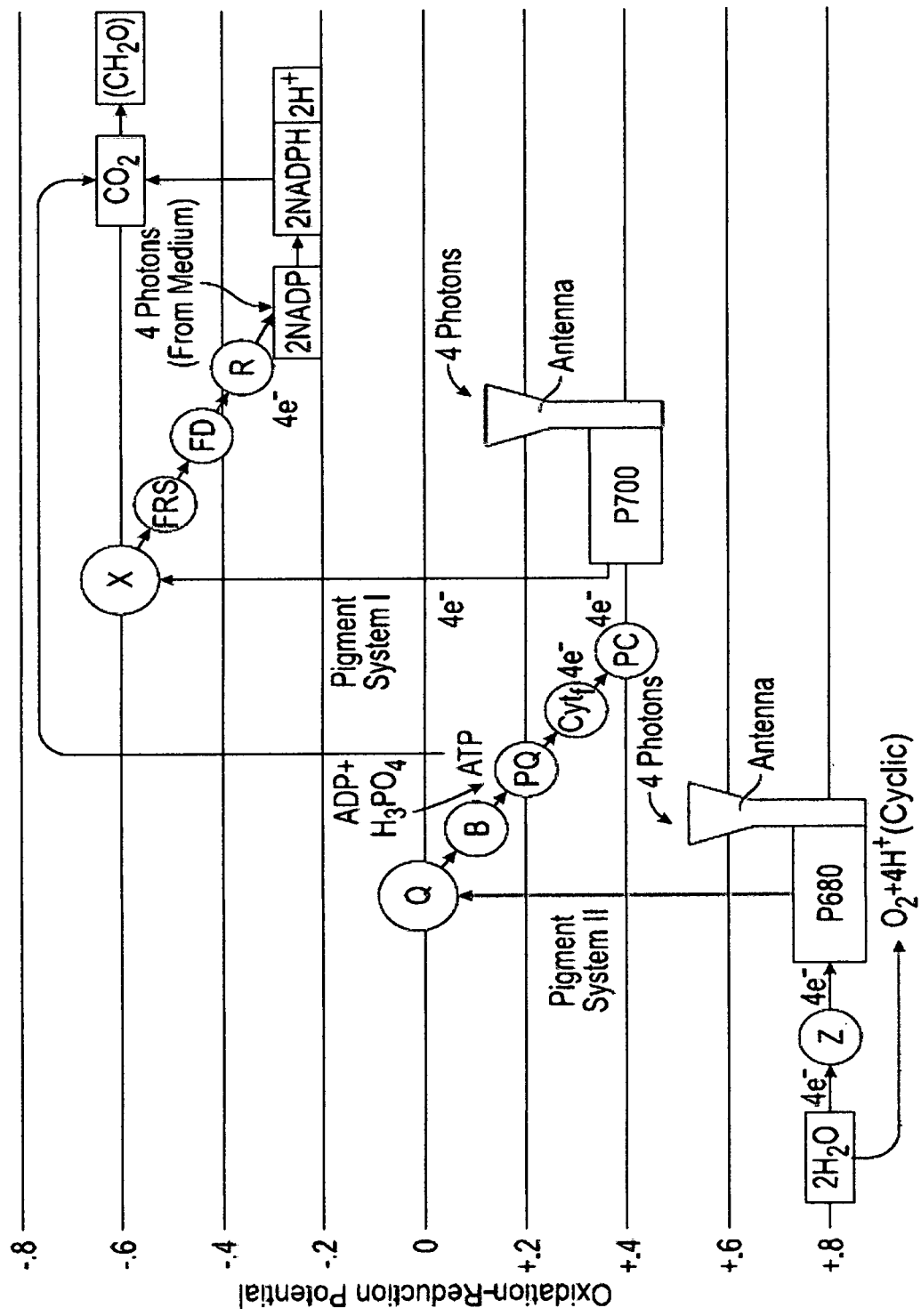
FIG. 1 is a schematic diagram showing flow of electrons in the Hill-Bendall model of photosynthesis.

The present invention is directed to methods and apparatus to produce and to exploit a new physical process, which is similar to the operation of lasers, but different. Similar to laser operation, this process takes place in a special group of molecules (and/or atoms), which can store input energy ("pumping") that can be in the form of light photons, or other forms of electromagnetic energy. Some of the possible methods for pumping excitation energy include the following:

Light (Electromagnetic Radiation): Light (either pulsed or continuous) can be used as a source of photons to excite electrons into excited states for the present process. The light source is not limited to the visible spectrum—it may be even be X-rays or infrared.

Electrical Discharge: Electrical discharges are sometimes used as pumping sources for lasers. Either a diffuse discharge through the gaseous medium, or an array of small arc discharges can be used to excite electrons in the laser medium. A similar process can be used for excitation of electrons the present process, preferably in the form of an array of discharges impinging upon a surface of a film of the molecular ensemble.

Chemical Reaction: Excited electrons in compounds or radicals produced by chemical reaction can be a source of energy input for the present process.

Electrical Current Though Medium: Passing a current through the P-N junction is employed to pump semiconductor lasers. Essentially most of the electrons traversing the energy step at the junction can produce an output photon. A similar process can be employed for the present process, in which a current is passed through the molecular ensemble to excite electron states that can produce energetic charge transport at right angles to the direction of the stimulating current.

Electron Beam: Some lasers are pumped by direct impingement of energetic electron beams striking the active medium. It would be appropriate in the present process to employ electron beams striking the surface of a film.

Gas Dynamic Process: Gas dynamic or plasma dynamic processes can be used to pump gas lasers, but while this would not in most cases be directly applicable to an ordered molecular ensemble, the present process can employ a molecular ensemble bombarded by gas stream, which can excite the electron levels within the ensemble.

Such input energy creates excited states of electrons to produce a population inversion with the number of electrons in excited states exceeding the number of electrons in corresponding lower energy states. The excited electrons not only are raised to higher quantum energy level, but also transfer to an adjacent molecule (or atom). The stored energy in multiple molecules (and/or atoms) can then be released via a process very similar to stimulated emission, in which the excited electrons transition to a lower energy state while simultaneously jumping to an adjacent unit within the structure.

This action is similar to that of lasers, because the pumping process raises the energy states of electrons in a number of atoms (and/or molecules); but, unlike lasers, the excited electrons are also transferred to a neighboring unit (atom or molecule). Once transferred, quantum mechanical selection rules do not allow the electron to decay (de-excite) back to its lower energy state within the same atom or molecule. In our process, the electron jumps to a neighboring unit as part of its decay transition.

Lasers amplify light passing through the "pumped" medium by a process known as stimulated emission. When a photon passes near a molecule or atom that has an excited electron, the oscillating electromagnetic field of the photon "stimulates" an excited electron to return its lower energy state, thereby giving up its energy and emitting another photon, which has the same wavelength and is traveling the same direction in phase with the photon that stimulated the transition. Repeated events of this kind build up the intensity of the light within the laser; in a laser the light is "coherent," because all of its photons are moving in the same direction, with the same frequency, and in phase.

In our process, as an electron decays by jumping into the neighboring atom or molecule, it stimulates that adjacent unit, which also contains an excited electron, to also decay and transfer its electron to the next unit down the line. This process can be continued down an arbitrarily long chain of excited units, and it would thus sum up or combine the excitation energies of all the excited electrons by depositing that energy into the motion of the charges. The chain of units does not have to be a long one; it could be as small as two individual atoms or molecules. This process causes a coherent electric pulse to be directed along the axis of the structured molecular ensemble. The electric pulse consists of a high-energy electron moving in one direction, with a high-energy hole moving in the opposite direction. The electron energy wave created can also be in a coherent form, and it can also include light emissions in some instances, such that it therefore has the same broad spectrum of applications as the emissions produced by a laser.

Similarly to the case of the laser, the electron energy wave created according to the present invention can be viewed as a stimulated emission. Stimulation can be spontaneous in accordance with the invention, meaning that certain of the excited electrons often begin to spontaneously decay back to their normal state in a statistical manner, as in the case of a laser, and this is a function of the amount of energy being pumped into the system. In other applications, it is appropriate to apply some form of external stimulation to the systems, in order to exercise control over the system. Any type of external stimulation can be employed, for example, electromagnetic energy or vibrational energy. When the charge level of an electron drops, it causes an oscillation which then stimulates other electrons, at the appropriate frequency.

The process comprises an Electron Polarization Wave Amplified by Stimulated Emission of Radiation (EP-WASER) to create energetic charge movement, which has enough energy to drive chemical reactions that normally would be impossible because the energy steps are larger than the energy in a photon of visible light. In certain embodiments, at the end of a series of the pumped units there is located a "docking site" interface that connects to a chemical reactant, e.g., a water molecule, which can be split into hydrogen and oxygen. The energy required to decompose water is larger than the photon energy (hv) of visible light; but our proposed process is capable of accomplishing this feat due to the novel mechanism described above.

An attractive approach to solar energy conversion is to directly utilize a process similar to photosynthesis which occurs in plants. With respect to this field of utility, the benefits of utilizing a photosynthesis-like conversion of solar energy to produce usable chemical fuels is widely recognized. However, the search for a suitable process is hampered by a lack of fundamental knowledge regarding the basic mechanisms of photosynthesis which allow the energy of several incoherent photons to be cooperatively utilized to split water molecules. Our research has led to the discovery of a novel mechanism to explain this efficient conversion of light energy. The process, which results in the formation of an electron energy wave in aggregated molecular ensembles, as discussed above, is now explained in more detail with reference to one non-limiting, exemplary type of molecule, namely, chlorophyll. A quantum mechanical model shows that in closely associated groups of molecules such as those comprising chlorophyll, light absorption can lead to electron transfer between adjacent molecules. This type of intermolecular electron transfer will populate a metastable state such as the chlorophyll triplet state (normally spin forbidden in isolated molecules). Successive photon- or other energy-induced electron transfers will thus create a localized population inversion. In the stimulated emission process, electrons return to the ground state of an adjacent molecule. This occurs because the decay of the triplet state is spin-forbidden within a given molecule.

Examination of the photosynthetic process shows that the energy conversion efficiency can be as high as 34% at the molecular level. Clearly a system which duplicates the water decomposition characteristics of photosynthesis would have many attractive features. Hydrogen and oxygen can be stored indefinitely and converted to electric energy with high efficiency (approximately 90%) in fuel cells. However, a process which duplicates natural photosynthesis is even more attractive because it can provide organic chemicals including food, and will generate no by-product pollutants during combustion.

Several attempts have been made to use photoredox reactions (involving ferrous ions or ceric ions) for photolysis of water. Other work has been directed toward multi-step decomposition of water. One investigation has attempted to modify the photosynthetic process in blue algae with dyes to accomplish hydrogen production. Potential efficiencies of these various approaches are lower than photosynthesis.

There is a lack of a feasible hypothesis to explain the mechanism that occurs in plant photosynthesis. This mechanism allows a plant to collect and integrate the energy of 8 or more low energy photons and utilize this energy in a single photochemical reaction to split water molecules. Quantum mechanical considerations indicate that simultaneous action of several photons of incoherent light is highly improbable. Photosynthesis must therefore involve the cooperative utilization of the energy of several photons. A method that duplicates this cooperative photon action in vitro creates the possibility of successful large-scale photochemical energy, for example, in accordance with one embodiment of the invention, the high efficiency solar decomposition of water.

In plant photosynthesis oxygen is not evolved from $CO_2$ but rather from water with hydrogen utilized for storage of chemical energy by the buildup of carbohydrates. The chemical balance of the carbon cycle is illustrated in FIG. 1. When the reaction shown at the top of FIG. 1 proceeds toward the right it represents the photosynthetic production of oxygen and ⅙th of a glucose molecule from water and $CO_2$. When the reaction proceeds toward the left, glucose is oxidized (as occurs in animal metabolism). As indicated, approximately 5 eV of energy are transferred by this process. A similar amount of energy is stored by splitting 2 molecules of water to produce 2 molecules of free $H_2$ and one of $O_2$.

The flow of electrons from water to carbon dioxide proceeds against an electrochemical gradient of 1.2 volts and requires two photochemical events. Four electrons must be transferred, one at a time, to liberate a molecule of oxygen and reduce a molecule of carbon dioxide to carbohydrate. The process begins with the absorption of a photon by the antenna of pigment system II (PS II). The energy of excitation is conveyed to a chlorophyll molecule in the reaction center of the photosynthetic unit; the molecule is designated P680 because one of the bands in its absorption spectrum is at 680 nanometers. The excited P680 transfers an electron to the acceptor Q, and subsequently recovers an electron from the donor Z. After Z has given up four electrons it regains them by oxidizing two molecules of water.

Experiments have shown that it is possible to make the first photosystem (PS II) act to split water and evolve oxygen even though the second system (PS I) is inactive, thus the possibility of utilizing the water-splitting part of the process independently.

As shown in FIG. 1 the difference, in chemical bond energies of the reactants and the products of photosynthesis represents 5 eV of Gibbs free energy. The process of photosynthesis requires an input of two groups of 4 photons (8 total) and each photon must have an energy 1.85 ev (lowest singlet excited state). If the energy of the incident light is just at this lower limit, the efficiency of photosynthesis is maximal. Thus the maximum efficiency of energy conversion is computed as $$5 \text{ eV}/(8(1.85 \text{ eV})) = \frac{5}{14.8} \sim 34\%$$

Since equal numbers of photons are involved in both PS I and PS II, use of only the first (water splitting) step approximately cancels the loss incurred by averaging over the solar spectrum. Thus, the 34% conversion efficiency represents a potentially realizable efficiency.

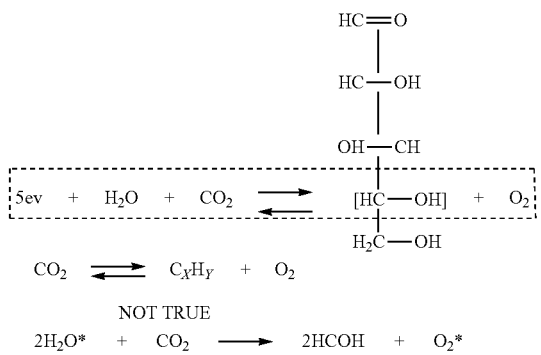

The water-splitting step (PS II) requires 4 electrons to be transferred, one at a time, from the reaction center (indicated by Z and P680 in FIG. 1) by 4 separate photons. During this process the electron donor associated with the reaction center acquires a positive charge which is neutralized when 2 molecules of $H_2O$ are split. The existence of 4 separate steps is demonstrated by experiments using a sequence of short intense pulses of light. It is found that oxygen production is maximized in a third flash and is thereafter followed by a damped cyclic variation with a period of 4 flashes. The existence of positive charges is supported by electron spin resonance work which indicates the presence of chlorophyll ions in the photosynthetic unit during the photochemical act.

Although not wishing to be bound by any particular theory, we believe that the photons are captured by a "light antenna" consisting of an array of closely associated chlorophyll molecules. The energy of these photons is then transferred to the reaction center by a highly efficient process. There is evidence that the excited state caused by light absorption subsides to the first singlet state of chlorophyll before the energy can be transferred to the reaction center. Thus, the energy is delivered to the reaction center in units that are less than 1.85 eV (the energy of the first singlet). This value of 1.85 eV is considered to be adequate to raise an electron from the reaction center to an acceptor energy level that is located as high as 0.8 eV upward in redox potential.

However, if multiple charges are to be transferred, only the first electron is transferred against a potential of 0.8 eV. The energy to move the succeeding electrons will be increasingly larger as the positive charge accumulates. If the charges are located in close proximity (which presumably they must be, since they act together on separate molecules of $H_2O$), the energy required to remove the last electrons will be significantly greater than 1.85 eV. Thus the electron would not be transferred with energy available from a single photon captured in the chlorophyll antenna.

Consider the process of creating the 4th electron-hole pair. Since 0.8 eV is required to free the electron from its bound site in the absence of any neighboring charges an additional amount of energy will be necessary to move the electron away against the electric field created by the 3 previously accumulated positive charges. This total energy is represented as follows:

$$E(\text{eV}) = 0.8 + \frac{2}{4\pi\varepsilon}\left[\frac{1}{r1} + \frac{1}{r2} + \frac{1}{r3}\right] \quad (2)$$

Where
e=the electron charge
ε=permittivity of the medium
$r_1, r_2, r_3$=the respective distances between site of the $4^{th}$ hole, and each of the 3 previous charges.

Figure 20:
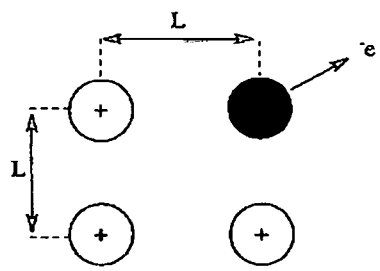
FIG. 20 shows the process for estimating energy of charges.

A rough approximation of a numerical estimate of the energy can be calculated by assuming that the charges are arranged in a square pattern as shown in FIG. 20.

A conservative and reasonable assumption is that L is less than the intermolecular distance of chlorophyll molecules in the photosynthetic unit. The spacing of chlorophyll molecules must be on the order of ~10 Å for efficient exciton transfer of energy between the "antenna" and the reaction center. If L=10 Å, then the energy to remove the 4th electron is ~4.7 eV. Clearly this energy step is so large that the 4th electron could not be transferred with 1.85 eV photons. In fact, trouble is encountered with all but the first electron unless there is some mechanism in the photosynthetic unit which can temporarily store the energy of several photons and then simultaneously release all of the stored energy.

We believe that photosynthesis depends as much on the structural ordering and arrangement of molecules in the photosynthetic unit as it does on the chemical constituents that are present. Most of the chlorophyll molecules function as pigments to absorb light. Other pigments, such as the carotenoids, that absorb strongly in parts of the spectrum where chlorophyll does not absorb (such as yellows and greens) are also present and provide better usage of the solar spectrum. We apply this principle to our invention, as well.

Figure 2:
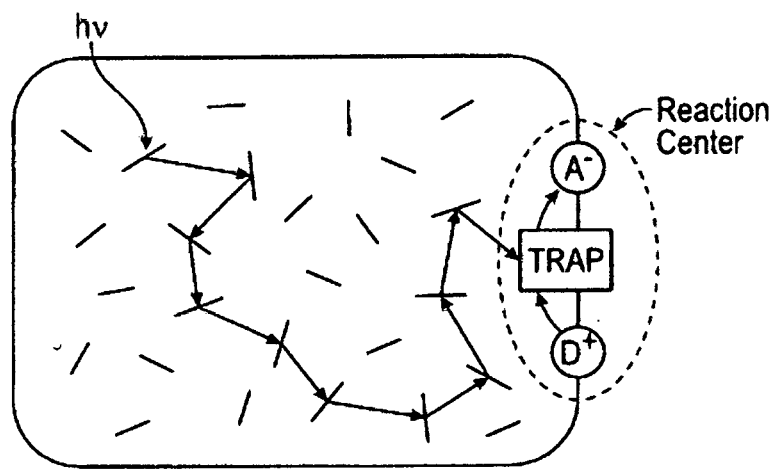
FIG. 2 is a schematic representation of a photosynthetic unit comprising a light-harvesting antenna and a reaction center.

The arrangement of these photosynthetic molecules is important in that they must act as a light antenna and then transfer the energy of photon absorption to a reaction center shown schematically in FIG. 2. However, the light antenna pigments do not seem to participate directly in the electron transfers or the chemical processes.

Figures 3A, 3B:
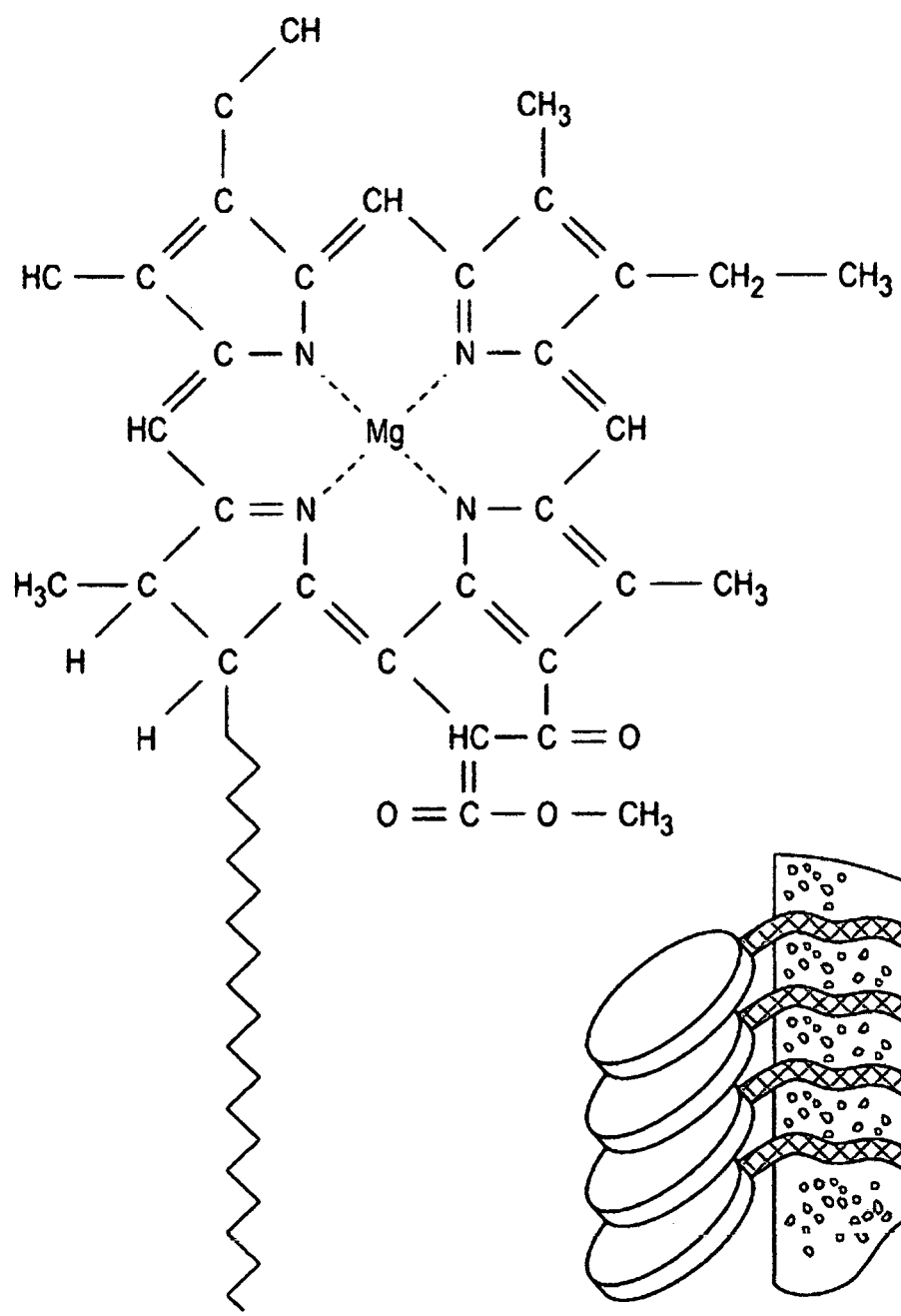
FIG. 3A shows the molecular structure of chlorophyll.
FIG. 3B illustrates schematically chlorophyll molecules anchored to lipid layers.

Chlorophyll a is found in all photosynthetic organisms except bacteria. It has a molecular weight of 893.5 and the structure shown in FIG. 3A. Several forms of chlorophyll occur in vivo. The chlorophyll molecules have a flat circular "head" (a porphyrin ring) approximately 15 Å by 15 Å in the center of which a magnesium atom is covalently bonded. Attached to the head is a phytyl "tail" approximately 20 Å in length containing 20 carbon atoms. The porphyrin ring is hydrophilic, and the phytyl chain is hydrophobic. The small groupings attached to the outside of the ring have little effect on the spectral properties. It is thought that the phytyl chain provides a nonpolar anchor to the lipid membranes insuring proper orientation relative to each other and the other components with which they interact. See FIG. 3B, which shows chlorophyll molecules anchored to lipid layers by their hydrophobic tails.

Chlorophyll b is found in most plants and differs from chlorophyll a only by having a formyl group in place of a methyl group on Ring II. It is not thought that chlorophyll b is essential to photosynthesis. The remaining forms of chlorophyll occur in bacteria and differ from green plant chlorophylls in that they contain slightly different porphyrin rings.

Photo systems I and II of higher plants appear to be structurally distinct entities, each with approximately 250 light-harvesting chlorophylls and a special chlorophyll group acting as a reaction center. The two photosystems have been separately isolated. Photosystem I contains chlorophyll a molecules, very little or no chlorophyll b and carotenoid pigments. The photosynthetic system known as Photosystem II consists of chlorophyll a with approximately one-third chlorophyll b.

The reaction center complexes are highly ordered molecular aggregates, and a relatively small number of chlorophyll molecules in a specific arrangement are present as parts of the reaction centers. These chlorophylls are the molecular aggregates which use photon energy to accomplish electron transfers.

Figure 4:
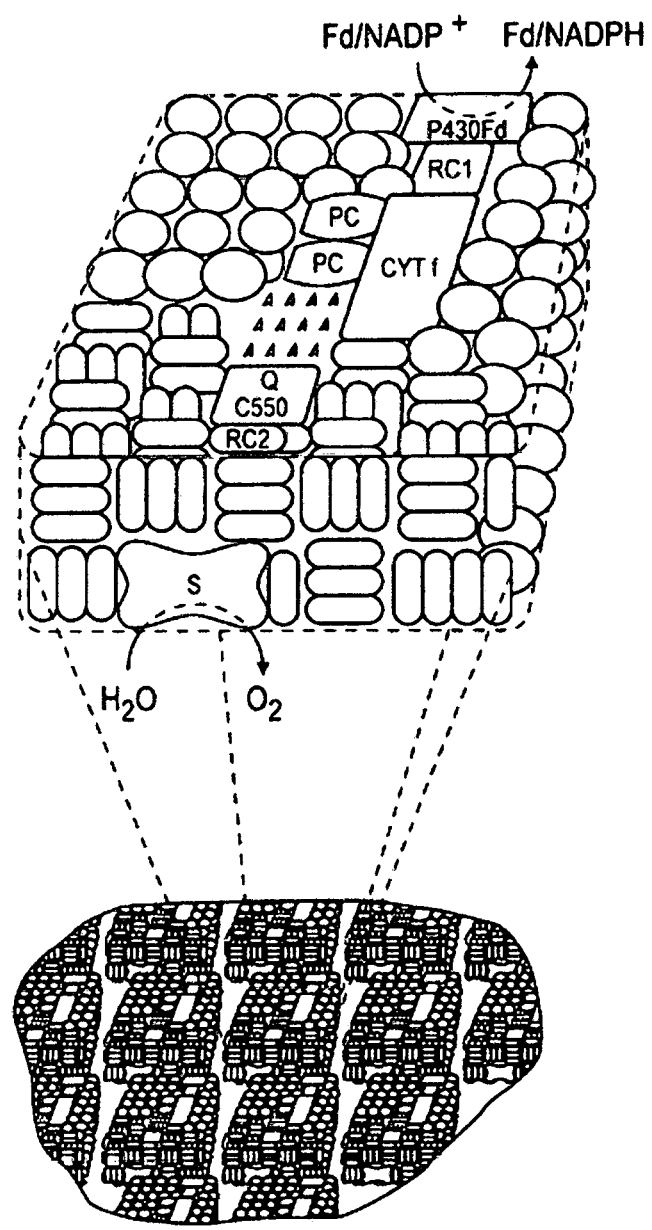
FIG. 4 is a schematic view of a pebble mosaic model.

A conceptual picture of the photosynthetic unit is shown in FIG. 4. This structure represents the pebble mosaic model of photosynthetic lamellae. The reaction centers as well as the electron donors and acceptors are depicted separately from light absorbing molecules which make up the bulk of the unit.

In the pebble mosaic model, a series of repeating units of the type shown in FIG. 4 are anchored to lipid membranes which form closed disc-shaped sacs. These thylakoid discs are stacked like wafers in the chloroplasts. The orientation and arrangement of the chlorophyll molecules in the lipid membranes is not known exactly. However, it is believed that at least some of the chlorophyll are very closely packed.

The outside of the porphyrin ring which forms the hydrophilic head of the chlorophyll molecules can be thought of as a closed-loop chain of 20 carbon atoms. Around the outside ring are a series of alternating double-single bonds (II electrons) which can be excited by photon absorption. Virtually all of the properties which relate to the electronic interaction with light involve the conjugated electrons in the porphyrin head. There are no conjugated bonds in the phytyl tail. The small groupings attached to the outside of the ring also have little effect on the spectral properties. Hence, it is reasonable to consider only the ring head in a simplified model of the molecule.

Taking the view of the porphyrin ring as being a segment of a one-dimensional atomic lattice which is joined into a closed loop, we can then make a quantum mechanical calculation to obtain a relationship for the energy levels of the electrons in the ring. Although this type of calculation is approximate, we will later show that the result has some additional generality.

The wave function for electrons in an infinite array of atoms with regular periodic spacing is a type of Bloch function and has the form of a plane wave modulated by a function with a period equal to the lattice spacing. When the infinite array of atoms is converted to finite length in a closed loop, an additional restriction is imposed on the wave function to exactly repeat itself after going all the way around the ring. The energy levels of an electron on such a closed ring are given by:

$$E_k = E_0 - 2A\cos ka$$
$$ka = \frac{2m\pi}{N}$$

Where $E_k$=energy of the kth level
N=atoms in the ring
a=lattice spacing
m=integer
All possible energies are obtained by choosing:
$-N/2 \geq m \geq N/2$ The values of $E_0$ and A are not obtained by this type of calculation. It is unimportant what value is taken for $E_0$ since all energies are relative to arbitrary choice of the zero level. The appropriate value of A can be obtained by comparing spectral data and heats of formation for various sizes of organic ring compounds. However, for our purposes in discussing the energy levels of chlorophyll, only the relative spacing between levels is of concern, so it is sufficient to note that A is a positive constant.

Figure 5:
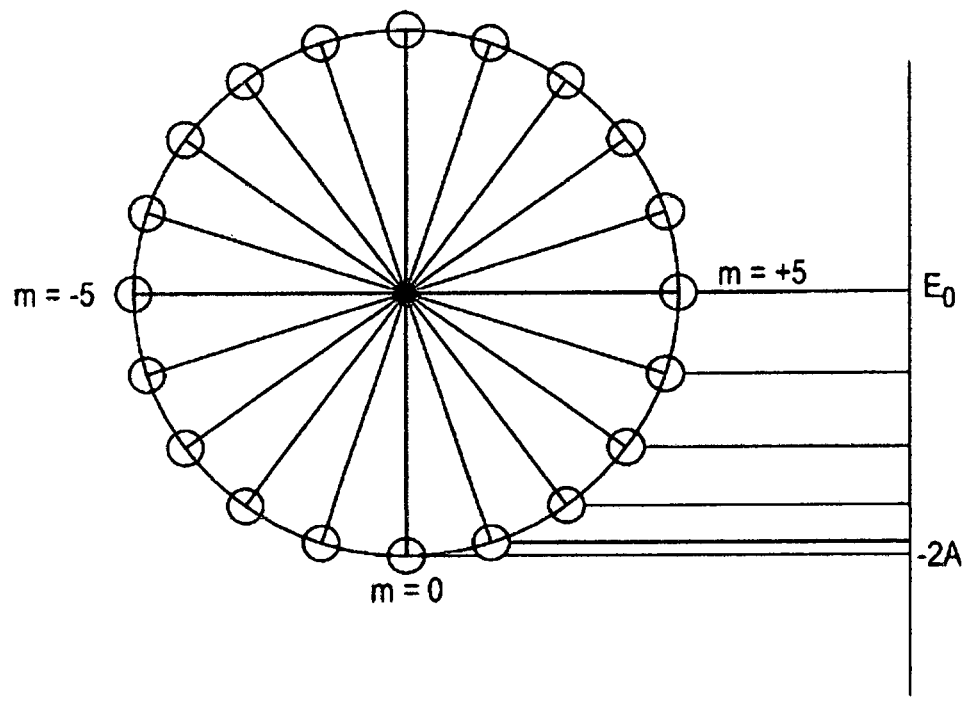
FIG. 5 is a diagram showing energy levels of electrons on a closed ring of 20 atoms.

A convenient representation of the energy levels in Eq. (5) is a circular diagram as shown in FIG. 5. The circle is divided into N (N=20 for the porphyrin ring) equal segments. The vertical distances between points on the circle are proportional to the cosine term in Eq. 5. The lowest energy level is obtained with m=0 and $E=E_0-2A$. This energy level can contain only two electrons with opposite spins by the Pauli Exclusion Principle. However, note that the other energy levels about m=0 each correspond to two values of m (i.e., m=±1, ±2 . . . etc.), so the higher energy levels can each contain up to four electrons without violating the exclusion principle. As each level is filled, an "energy shell" is completed and the configuration is especially stable at those points. This is analogous to the atomic energy level structure in inert gases.

To find the ground state energy of the molecule, we first consider the molecule with all electrons removed (i.e., 20 times positively ionized). The total binding energy is computed as the electrons are added filling the lowest level first, the second lowest next, and so on until all the electrons are present. It is assumed that as the electrons are added to the system that the energy levels are not changed by electron-electron interactions. The total energy can be represented in a simple diagram using Eq. 5 with N=20 and $E_0$=0 (The value of $E_0$ is arbitrary as stated previously.)

Figure 6:
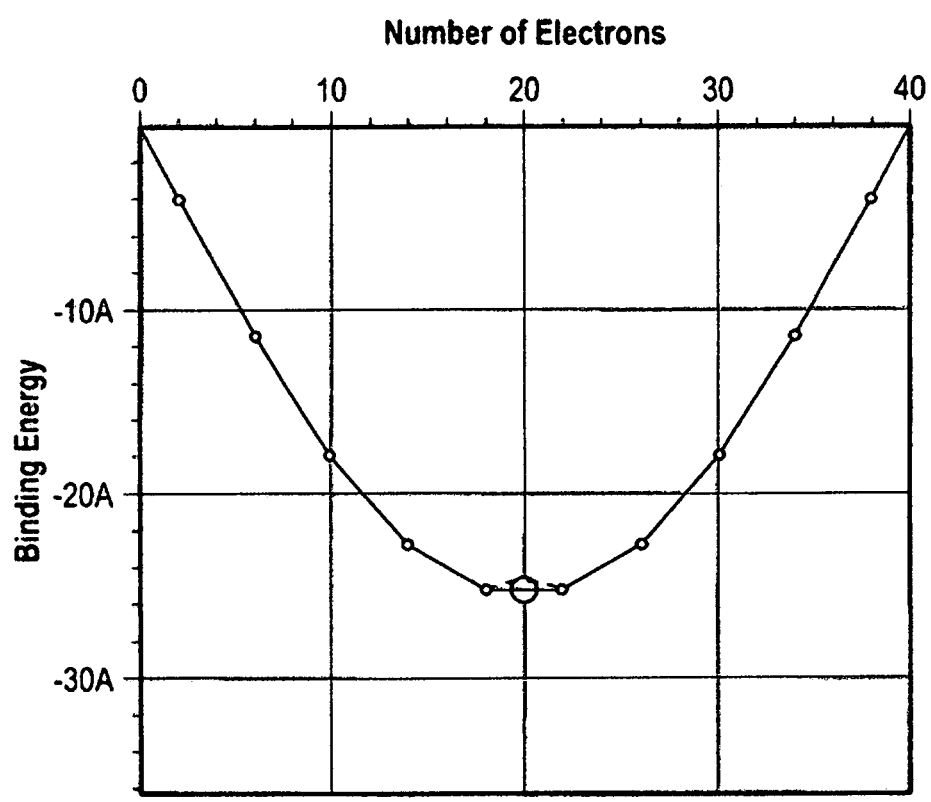
FIG. 6 is a chart showing total binding energy of electrons on 20 atoms of the porphyrin ring in chlorophyll versus the number of electrons on the ring.

FIG. 6 is a plot of the total binding energy of the 20 atom porphyrin ring versus the number of electrons in the ring. The horizontal axis, which shows the number of electrons, runs from 0 to 40. At the midpoint of the curve, where there are 20 electrons (one for each atom), the molecule is neutral. At the beginning and end of the binding energy curve, the molecule is 20 times positively ionized and 20 times negatively ionized, respectively.

Referring to Eq. 5 and the energy level diagram of FIG. 5 we will see how the binding energy curve as shown in FIG. 6 is built-up. The first two electrons go in at the m=0 level and each contributes an energy of −2 A for a total of −4 A. Thus, we have the first point at two electrons and energy −4 A (The energy axis in FIG. 6 is plotted in arbitrary units of A). The next four electrons go in at the m=1 level, and each contributes −2 A cos(2/20)=1.9 A. This gives the second point at six total electrons and total energy −11.6 A. This process continues in segments of four electrons, each with decreasing slope in the energy curve, until we have reached 18 total electrons. The next level to be filled is at m=5, but cos [2(5)π/20=cos(π/2)=0. There is no appreciable change in the binding energy as we go from 18 to 22 electrons. Thus, the bottom of the binding energy curve is flat. Furthermore, a closed energy shell occurs not with the neutral molecule, but with two electrons either added or removed.

The consequence of the flat bottom on the binding energy curve is that a porphyrin ring can gain or lose two electrons with a negligible change in the total binding energy. Furthermore, it would tend to do so to improve its stability by closing the energy shell. With two molecules next to each other, additional stability is obtained by two electrons moving from one molecule to its neighbor. This will create a closed shell in both molecules, (one positively ionized and one negatively ionized, but with the overall pair being neutral.) The EPWASER mechanism employs the concept of pumping by transfer of electrons between molecules without significantly changing their energy levels, and we use chlorophyll here as one example of such a molecule. By applying this same methodology, it is routine to identify other suitable compounds that exhibit this type of behavior with respect to their energy level properties. Software is commercially available that enables calculation of quantum energy levels for any compound.

The simplistic model (20 atom ring) which was used to develop the binding energy relationship given by Eq. 5 and FIG. 6 is a very approximate representation of the actual molecule, because of porphyrin ring contains other atoms besides the 20 carbon atoms. However, we shall now show that the result of the calculation for chlorophyll has additional generality. The derivation of Eq. 5 depends only on the symmetry properties of the system. Nothing is assumed regarding the type of potential which binds the electrons to the atoms. Instead of a ring of atoms, a ring of any other subunits would be adequate. The subunits are ideally identical and regularly spaced around the ring. As long as this condition is met, the result obtained in Eq. 5 remains valid. It can be verified that as long as the number of units which make up the ring (the value of N in Eq. 5) is a multiple of four, the binding energy curve has a flat bottom for the last four electrons. In other words, rings of 4, 8, 12, 16 or 20 . . . etc. units all have the property that two electrons can be added or removed without materially changing the binding energy. This permits the model to be applied to porphyrin rings or similar molecules (N=multiple of 4).

Figures 18A, 18B:
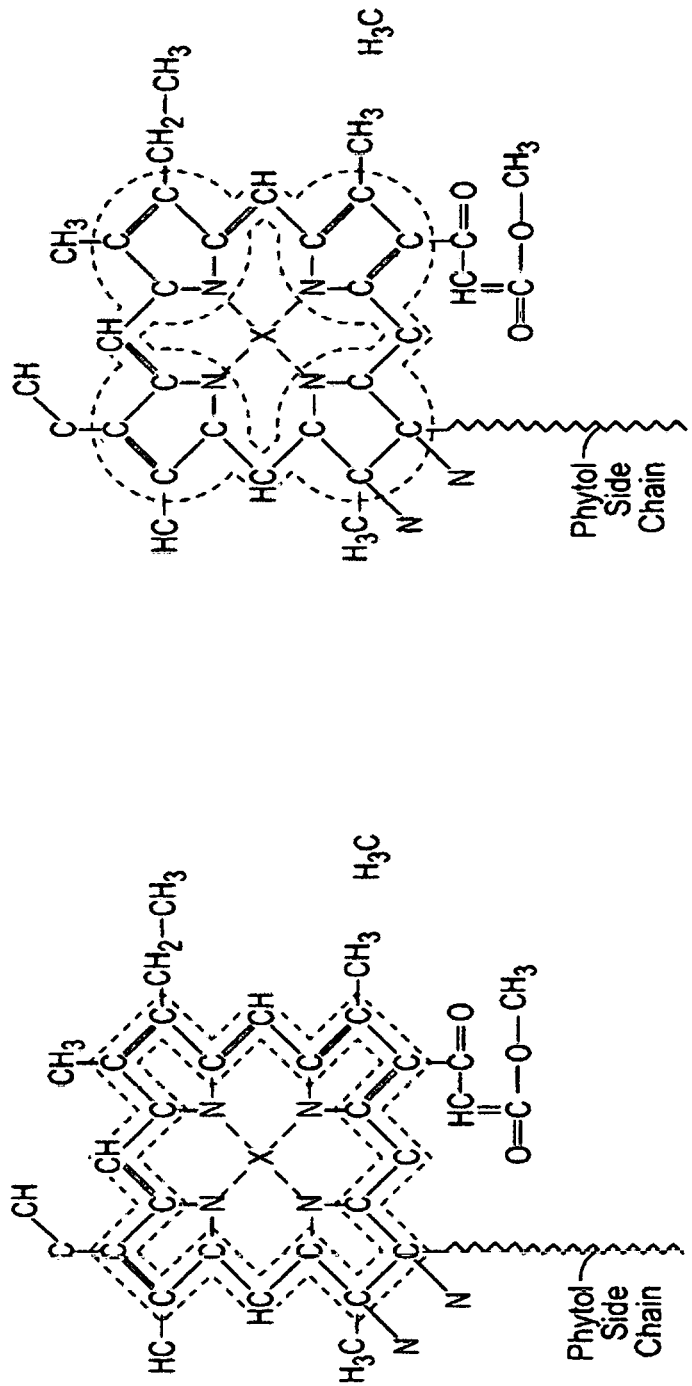
FIGS. 18A, 18B and 18C illustrate three different ways of subunit grouping in the porphyrin molecule.
Figure 18C:
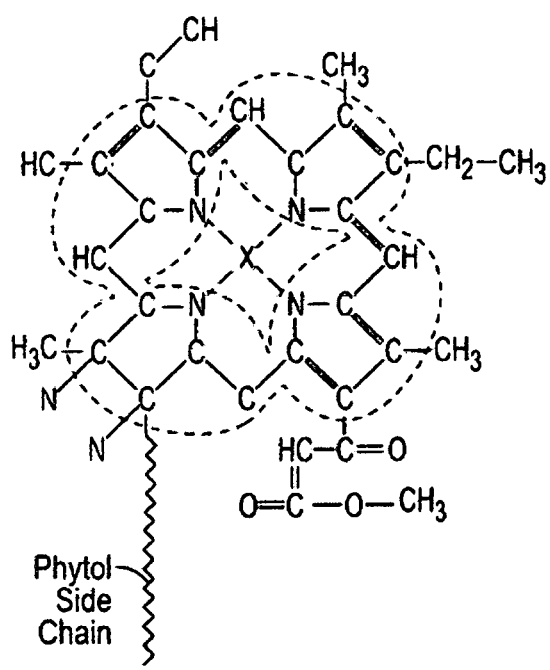

The porphyrin ring of the chlorophyll molecule is made up of four sub-units which are pyrrole groups. Thus, it is possible to group the atoms which make up the porphyrin ring in any of three possible arrangements shown in FIGS. 18A, 18B and 18C. In FIG. 18A the porphyrin ring is considered as a closed ring of carbon atoms, forming 20 units shown by the dashed lines. In FIG. 18B, the ring is composed of 4 groups with 4 connecting atoms, to form a total of 8 subunits. In FIG. 18C, the ring is composed of 4 subunits, again shown by the dashed lines. All of these arrangements have four-fold symmetry. Consequently, no matter which arrangement is used to model the porphyrin ring, a flat-bottomed binding energy curve of the type shown in FIG. 6 will result. Thus, the calculation that two electrons can be either added or removed from the porphyrin ring with only a small change in the binding energy has considerable generality despite the fact it was derived on the basis of a 20 atom ring.

Although chlorophyll a has 20 atoms in its outer ring, only 18 of these atoms have alternating double-single (conjugated) bonds. It is believed that the well-known Huckel's rule (4N+2), which describes conditions for stable aromatic ring compounds, applies to the 18 atoms (not 20) in chlorophyll. This brings into question how many atoms should be used to estimate the energy levels for electrons with a periodic wave function on the chlorophyll ring—should the number be 20 or should it 18, which is a 4N+2 number. The operation of the EPWASER process does not depend on the number of atoms in ring molecule. The only thing of importance is that the binding energy is such that an excited electron can easily transfer from one molecule to the neighbor.

In the treatment of the previous pages it was assumed that the Schrodinger wave function only makes a single loop around the ring and then reconnects with matched phase. However, other pathways are possible. This is particularly relevant when there is group of closely packed rings, such that the wave function of one ring might interact with neighboring molecule(s). In fact the combination of molecules in a dimer (or larger ensemble), may be regarded as something like one "super molecule"

In addition to single loop orbital paths, there can also be loops as proposed by Clapp to describe the spectrum of Chlorophyll [Clapp, Roger E.; "Loop Currents in Chlorophyll-a"; Basic Research Associates, Incorporated, Cambridge, Mass. 02138, USA; Theoret. Chim. Acta (Berl.) 61, 105-133 (1982)]. For a Möbius loop, the wave function makes a "twist" which creates a phase shift equal to one half wavelength as it goes around one time. The path completes the phase change to match the beginning point after 2 circulations and reconnects. This type of behavior would be more likely to occur with closely stacked molecules having rings adjacent to each other. It is possible to apply the same type Bloch wave function calculation to a Möbius loop, and estimate the binding energy. In that case the phase shift would be an odd numbered (2m±1) multiple of π. There is a similar equation for the energy levels with odd multiples of π:

$$E_k = E_0 - 2A*\text{Cos}[(2m\pm1)\pi/N]$$

Where m is an integer and N is the number of atoms in the ring

Figure 19:
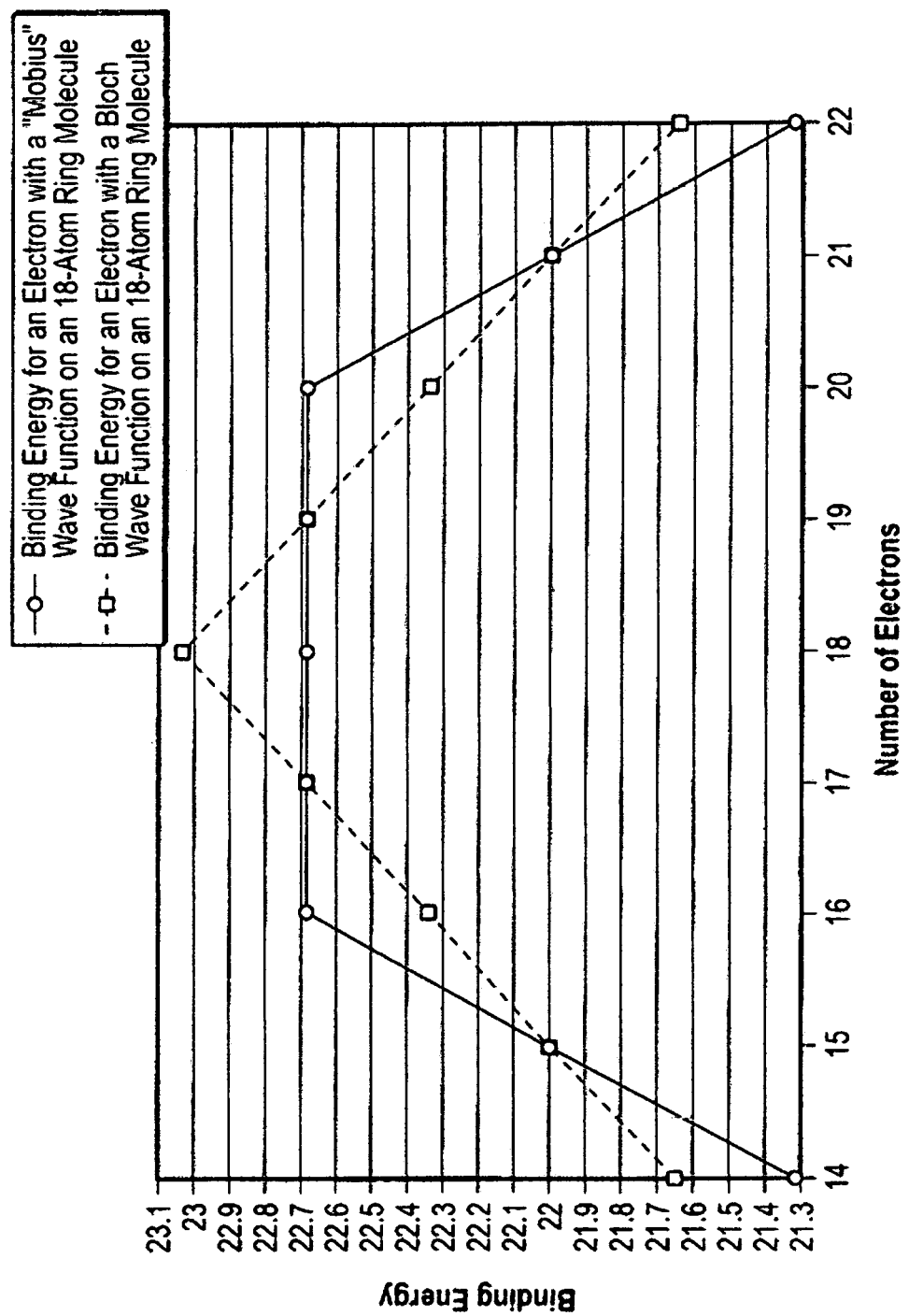
FIG. 19 is a graph of electron binding energy for an 18-atom ring molecule.

Applying this equation to calculate the binding energy curve for an 18 atom ring with a Möbius pathway gives a curve with flat bottom binding energy as shown in FIG. 19 of the drawings. The derivation of this curve is very simple and straightforward. It can be easily done with a pencil and paper calculation.

FIG. 19 shows the calculated relative binding energy (arbitrary units plotted positive) for an 18 atom ring with 2 cases: one with single loop pathway (dashed line with diamond data points) and also for Möbius loop (solid line with circles marking data points). Looking at the Möbius curve there is no change in the binding energy from 16 through 20 electrons. In other words, the molecule could gain or lose electrons without gaining or losing energy, which is important.

The question about considering chlorophyll as having 18 atoms instead of 20 is not significant regarding the number of atoms in a ring molecule that can serve to form the fabricated and ordered ensemble for EPWASER media. According to the Huckel rule: 4N+2 is required for a planar aromatic ring, which are preferred for use in the present invention. However, the quantum mechanical calculation of energy levels with Bloch-type of wave functions shows that multiple of 4N produces a flat-bottomed binding energy curve; where electrons can be exchanged with the neighboring molecules and have no significant change in total binding energy. It was shown earlier that, within an ensemble of closely spaced molecules, wave functions with 2 loops around the rings of adjacent neighboring molecules should be considered; and/or Mobius loops with a 180° phase shift. Either a two-loop path or a Mobius loop, yields a flat-bottomed binding energy curve for ring compounds with 4N+2 atoms. Thus, the number of atoms in the "loop" is more determinative of the binding energy curve, whereas the number of pi electrons in the loop is more determinative of the aromaticity, which alleviates any apparent conflict in the desired number of atoms.

The binding energy calculation depends on the number of atoms in the ring, whereas the Huckel rule applies to the number of conjugated electrons with pi bonds. The Bloch wave function quantum mechanical calculation is very simplistic: It only assumes that the particles are in a periodic lattice of the potential wells, and there is no interaction between electrons (independent particle approximation). This simple calculation does not make any distinction between the type of orbitals for any electrons under on the lattice—they could be π electrons or other orbital shapes. The energy levels calculated with this simplistic model, depends on the number of potential wells (atoms) in the loop pathway—not number (or type of) electron orbitals.

Consider a case like the chlorophyll a molecule, which has 20 atoms in its outer ring, but only 18 conjugated π bond electrons. There is no conflict in the fact that Chl a has a flat-bottomed binding energy curve with the number of atoms [20=4×5], and yet the molecules is an aromatic planar ring in accordance with the Huckel rule with 18 π electrons [18=4×4+2]. There are other molecular candidates, which have a similar situation with 4N atoms, and for (4N+2) π electrons.

There are many suitable molecules having varying numbers of carbon atoms in the ring, e.g., following the rule of 4N+2, that are useful for EPWASER media, such as a ring containing 18 atoms, as discussed above. The molecule coronene, which has 18 atoms in its outer ring is such a candidate that we have tested.

Figure 21:
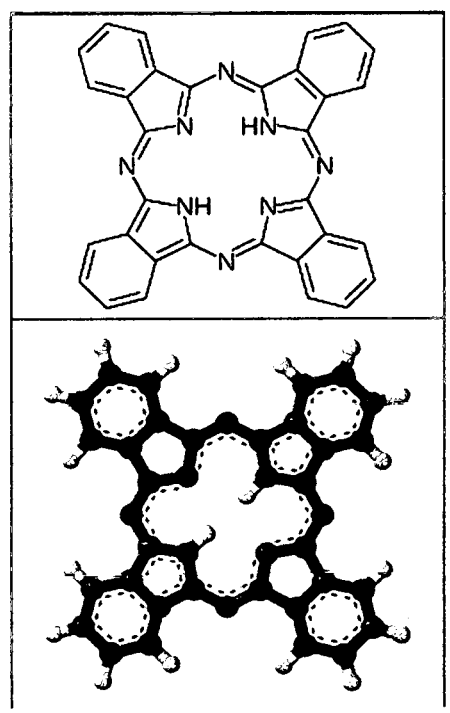
FIG. 21 shows the molecular structure of phthalocyanine ($H_2Pc$).

Another molecule is that of phthalocyanine (H$_2$Pc) and its derivatives. This is an aromatic compound, which is a dye containing both carbon and nitrogen atoms. See FIG. 21, that shows the structure of this compound.

This is a relatively complicated structure, and its innermost ring has 16 atoms composed of both carbon and nitrogen. There are 18 π electrons, but they are delocalized There is (somewhat imperfect) 4-fold symmetry in the inner ring of H2Pc, and the overall molecule does have 4-fold symmetry.

Phthalocyanines are structurally related to other tetrapyrrole macrocyles including porphyrins. They feature four pyrrole-like subunits linked to form a 16-membered inner ring composed of alternating carbon and nitrogen atoms. Both porphyrins and phthalocyanines function as planar tetradentate dianionic ligands that bind metals through four inwardly projecting nitrogen centers. Such complexes are formally derivatives of Pc$^{2-}$, the conjugate base of H$_2$Pc, and are very suitable for conducting chemical reactions, especially for supplying energy from EPWASER to chemical reactions. Phthalocyanine and derived metal complexes (MPc) tend to aggregate, which therefore facilitates formation of fabricated/ordered ensembles according to the invention, and, thus, have low solubility in common solvents. Many phthalocyanine compounds and metal complexes (MPc)are, thermally, very stable and do not melt but can be sublimed.

The molecule coronene, which has 18 atoms in its outer ring is such a candidate that we have tested. Coronene solution was deposited very slowly in small droplets onto a glass slide. Evaporation was controlled so that the material had an opportunity to form small crystals of coronene on the slide surface as the solvent evaporated. When this ensemble was irradiated with 405 nm laser excitation source, it produced bright emission, which was a spectrally very narrow line in the green range of the spectrum. This type of response was only seen with crystalline coronene—a very different, broader spectrum, fluorescence was observed from coronene in a solution of hexane. Line narrowing and brightness amplification are characteristics which indicate output produced by stimulated emission. Light output driven by stimulated emission is considered to be evidence of operation according to the invention.

Figure 7:
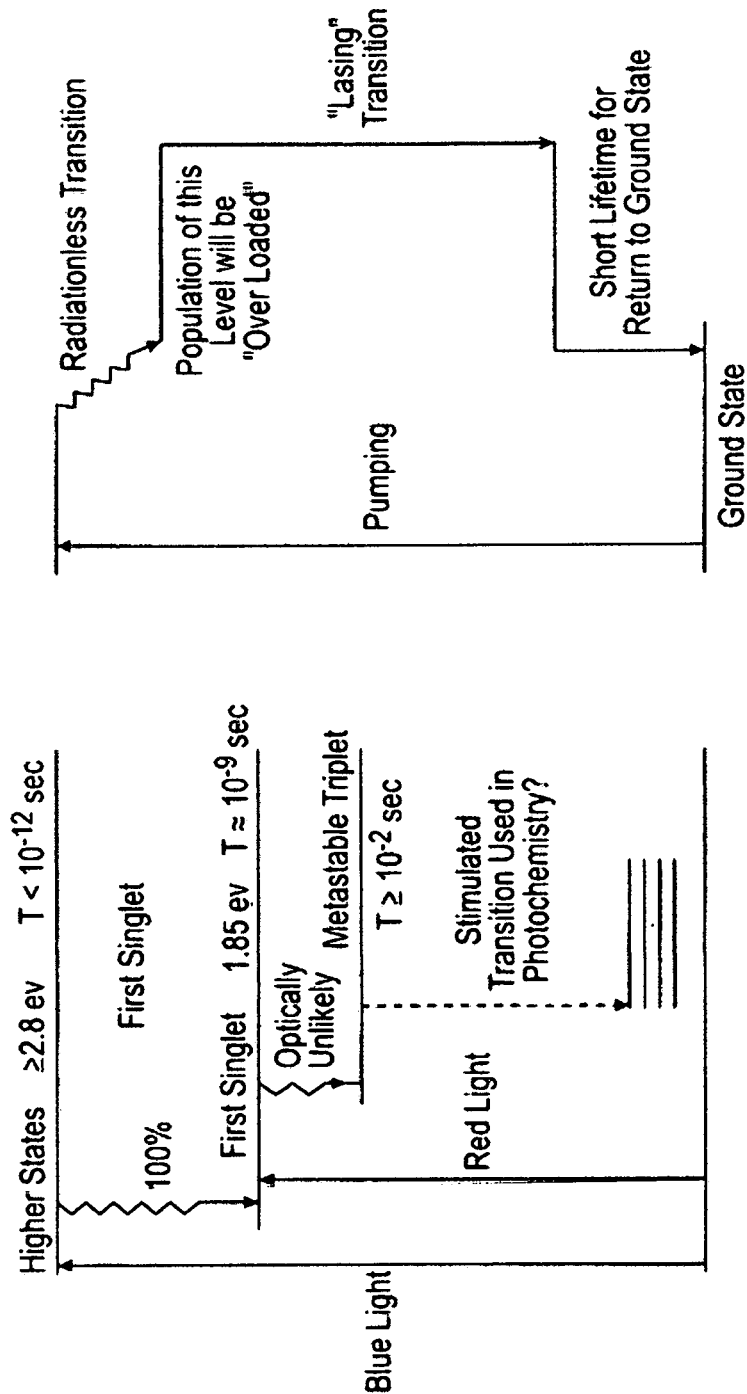
FIG. 7A is a chart showing the energy levels in chlorophyll.
FIG. 7B is a chart showing the energy levels in an ideal 4-level laser system.

A diagram of the energy levels which can be excited by light absorption in chlorophyll is shown in FIG. 7A. The lowest absorption band represents the singlet state located approximately 1.85 eV above the ground state. Absorption in any higher singlet states decays into the first singlet state by internal conversion before the excitation is lost or transferred. There is also a metastable triplet state which is located slightly below the first singlet.

The triplet state has an extremely long lifetime because the transition back to the ground state is forbidden by spin prohibitions. Conversion between singlet states and triplet states is possible and known. However, this is unlikely because a reversal of the electron's spin is required. In the current concept in the literature of photosynthetic processes, the role played by the triplet state is believed to be small. The main reason for the de-emphasis of the triplet state is the fact that it has a low probability for excitation by light absorption or subsequent intersystem crossing. As mentioned earlier, light absorbed in the chlorophyll molecules of the "light antenna" is believed to be transferred to the reaction center only as a singlet state excitation.

A mechanism is described here that allows the energy of several incoherent photons to be stored in aggregates of molecular or atomic structures, which are composed of atoms or molecules with energy levels as described earlier (FIG. 6) and then released preferably coherently.

Before beginning the discussion of EPWASER, the characteristics of stimulated emission are briefly reviewed. In order to obtain lasing action, an excited state with a long lifetime is required. This state is populated far above the equilibrium level. The resulting de-excitation of this level through stimulated emission produces the lasing action. However, the requirement of a long lifetime (a forbidden transition) also implies a very small cross-section for adsorption of light. Thus, it is seldom possible to directly pump the level which is involved in the lasing process. As a result, an indirect pumping scheme is most often used.

First, some level slightly above the lasing level is pumped by light absorption or some other means of energy input (see FIG. 7B). A radiationless transition (e.g., collisional) is used to transfer this excitation to the metastable level which becomes overpopulated. In this way the problem of a low adsorption cross section implied by a long lifetime is avoided.

Stimulated emission occurs when a photon passes in the near vicinity of an excited atom. If the energy of the photon matches the excited atom level, the oscillating electric field of the photon can stimulate the excited atom to decay by emitting a second photon. Unlike ordinary light (spontaneous emission) this second photon is emitted in the same direction and in phase with the first photon. Thus the oscillating electric fields of a group of photons produced by stimulated emission are vectorially additive. Very large transient electric fields can be produced in this way, as has been demonstrated with lasers.

The coherent electric field explains generally how an electron can be removed from a donor which has previously accumulated a positive charge. More specifically, however, an electron is transported by a process slightly different from stimulated emission of radiation. This process involves stimulated emission to produce an electron polarization wave. We will now explain how this occurs.

Figure 8:
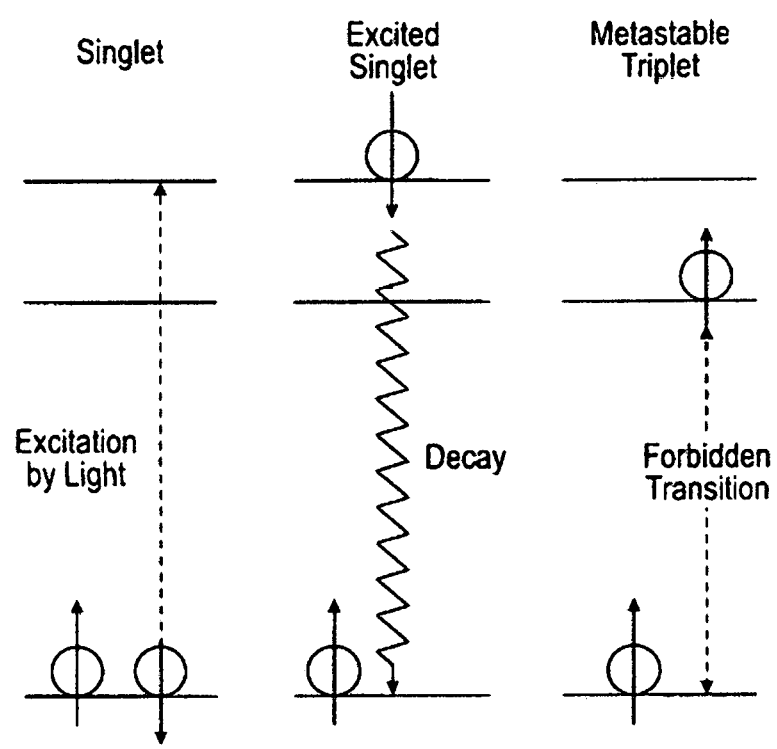
FIG. 8 is a chart schematically showing three types of electron transitions.

To begin the description, it is helpful to consider explicitly the difference between ground state, excited singlet state, and metastable triplet state as shown schematically in FIG. 8. Inspection of the figure shows why it is difficult for an electron to achieve the required spin alignment to enter the metastable triplet state. Mechanisms that can change the spin are magnetic fields, and collisions, which are not present in the system. The situation shown in FIG. 8 represents an isolated molecule. However, the situation is somewhat different if we consider more than one molecule in close proximity. In the previous discussion of the binding energy of electrons in suitable molecular structures as described earlier herein, we have shown that an electron can be transferred with very little change in the total energy. Thus, if a neighboring molecule is close enough that the wave function of the excited electron in a singlet state overlaps the second molecule, excited electron transfer to the adjacent molecule can take place.

Figure 9:
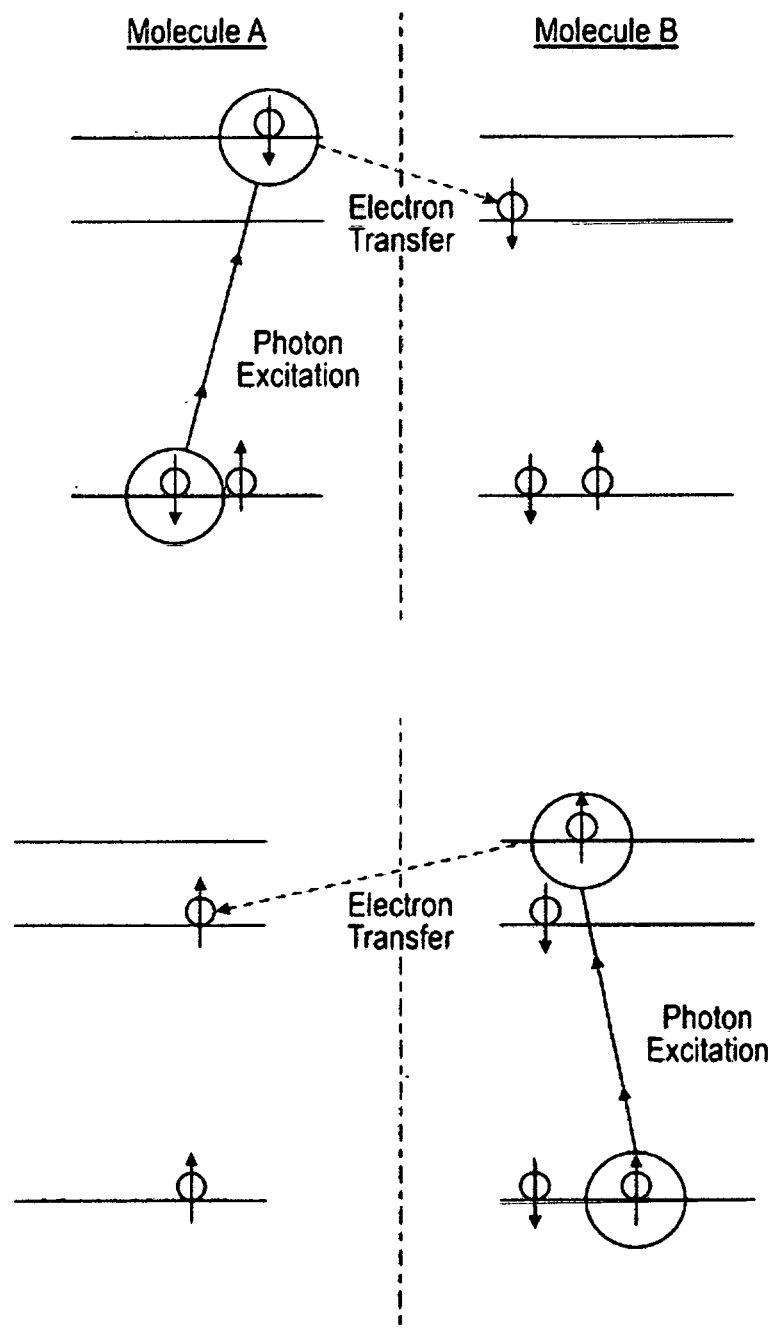
FIG. 9 is a chart schematically showing triplet state formation by electron transfer in chlorophyll dimer.

As an example, consider a dimer, two closely associated molecules, A and B, as illustrated in FIG. 9. Assume that a photon is absorbed in molecule A creating an excited singlet, and the excited electron subsequently transfers to molecule B. Molecule A is now positively ionized and molecule B has one extra electron. Suppose a second photon is now absorbed in molecule B, exciting one of the ground state electrons into a singlet state, and this electron transfers back to molecule A. The result now is that we have two molecules each with spin-aligned electrons in excited triplet states.

Figure 10:
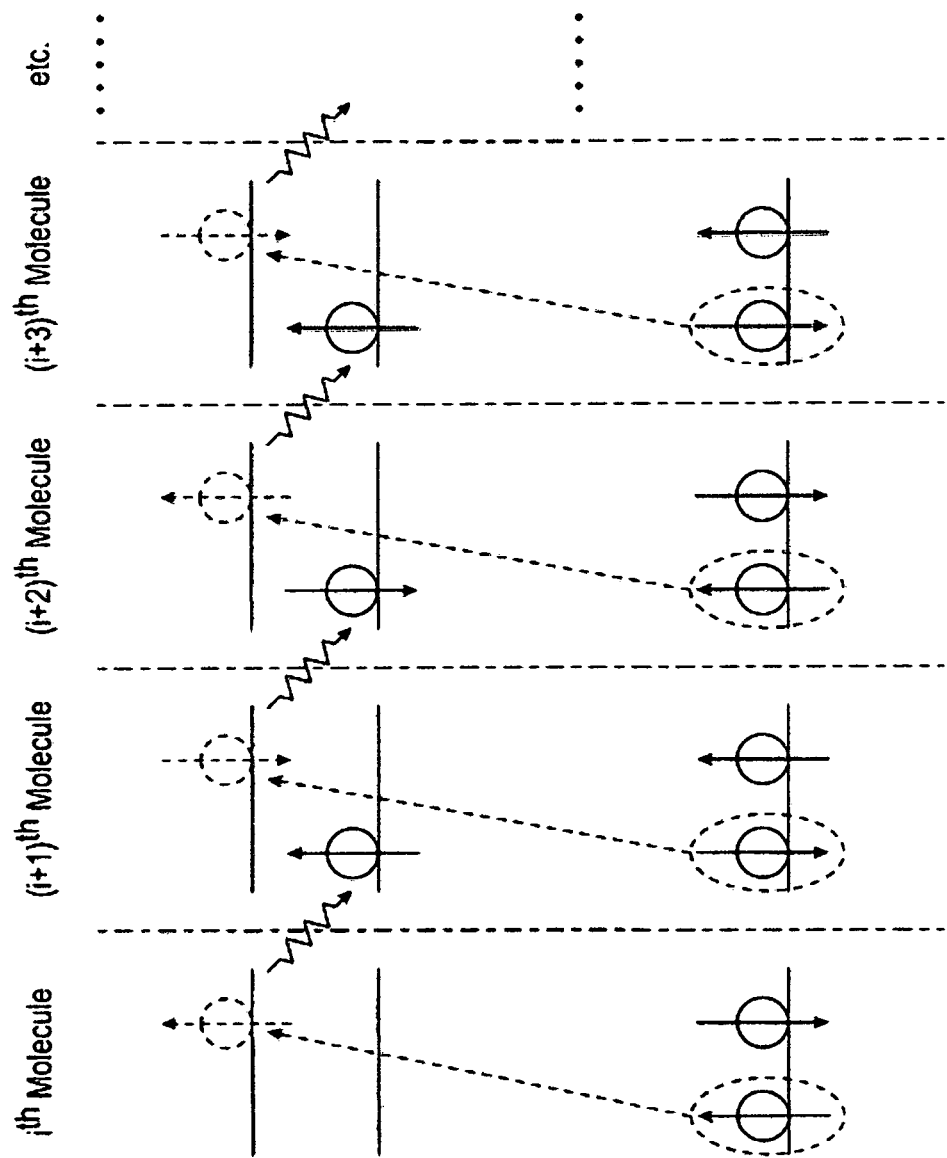
FIG. 10 is a schematic chart showing pumping of an ensemble of molecules by electron transfer from the singlet state to the triplet state of an adjacent molecule.

This type of process is not limited to two molecules. A group of any number of molecules can also be pumped into the triplet state if they were all ordered in close proximity. A schematic of how this can occur is shown in FIG. 10. There are several criteria that will determine how long the stack of structures will be, including the breakdown voltage of the media that encapsulates the stack, how large a voltage field the structure can withstand, and how efficient the excitation system is. Ultimately, the length of the stacks depends on the amount of energy needed for any particular utility. For a chemical reaction, such as water splitting, a stack length of about 2 units will suffice; however, for an application such as photovoltaic energy conversion, a stack length sufficient to generate a voltage of several 10's of volts is needed. Each unit in a stack generally contributes from about 0.5 to 1 volt.

In FIG. 10 we see that each molecule in a linear array which makes up an ensemble donates one electron to its neighbor by the same process as described for the two coupled molecules. The electron which is transferred is first excited to the singlet state by light absorption and produces a triplet only after being transferred to the adjacent molecules. One photon per molecule is necessary to excite the entire ensemble into the triplet state. After each molecule is excited to the triplet state the electron spins are aligned in each molecule, but the direction of the spins alternate between adjacent molecules.

Referring once again to FIG. 10, the spins of adjacent molecules are alternating. Thus, decay of an excited electron between adjacent molecules is spin-allowed, while decay within a particular molecule is spin-forbidden. Consequently, the decay of the ensemble occurs when an electron goes from the excited triplet state of a given molecule to the ground state of an adjacent molecule. This produces an oscillating electric field which in turn stimulates the next molecule within the line to decay in a similar fashion.

Figure 11:
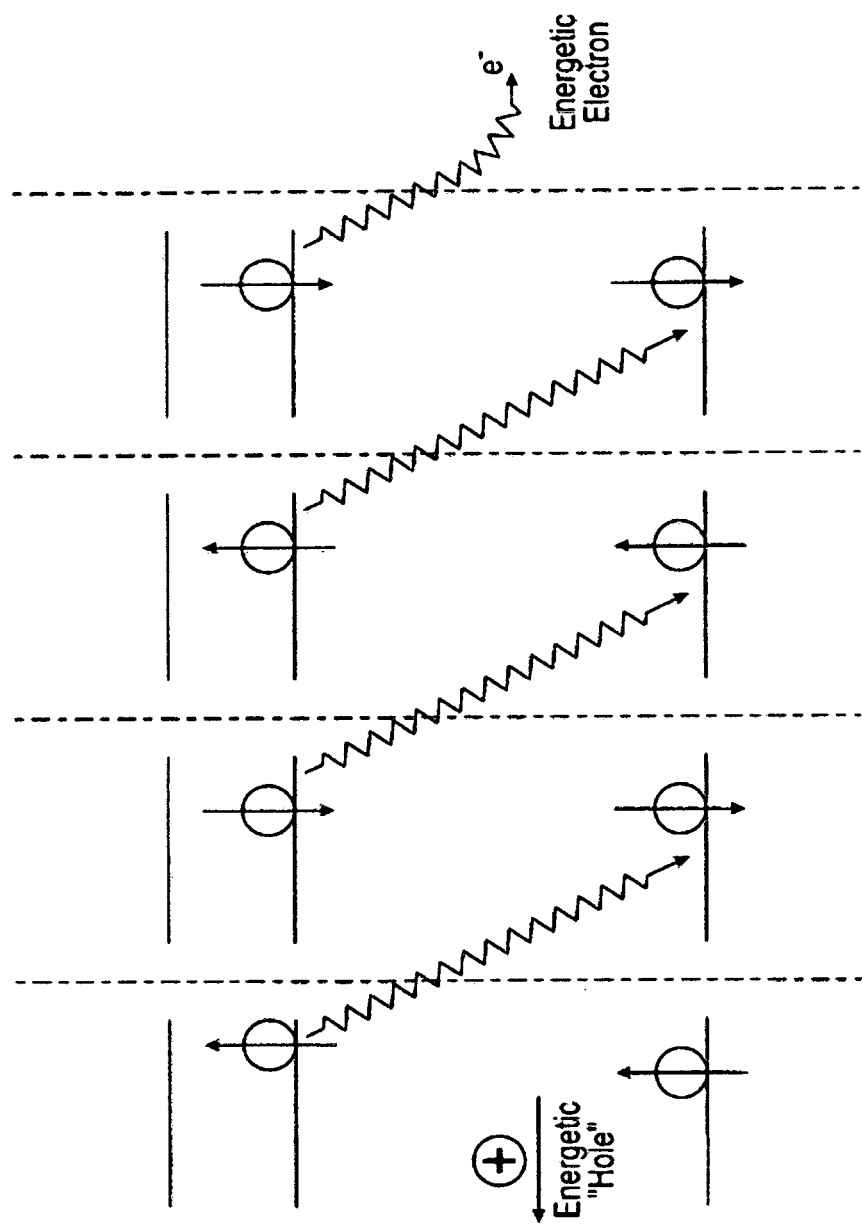
FIG. 11 is a schematic chart showing the decay of a molecular ensemble by a stimulated emission of an electron polarization wave.

An illustration of how this can occur is shown in FIG. 11. The following sequence of events occurs. Somewhere within the group, perhaps starting at one end of the stack, an electron in the excited triplet state goes to the ground state by crossing over to the adjacent molecule. At the same time it generates an oscillating electric field with the proper frequency to stimulate that molecule to also decay. Since there are now three electrons in the molecule it has a very high probability for decay into an adjacent molecule causing the next down the line to do likewise, and so on. The result is that one electron is transferred down the entire stack in a series of sequential steps. At each step the energy stored in the triplet state is given up and added to the oscillation which moves down the line. The particle which travels here is not a photon but rather an electron polarization wave.

The quantum mechanical description of the moving particle is more like a polaron than a photon. The distinguishing feature between the two types of particles is that the polaron contains a charge as well as an oscillating field. Unlike stimulated emission of photons, the EPWASER decay process takes place along the axis of the molecular stack in order for the quantum efficiency in the process to be high. This decay process may also be thought of as generating a positively charged hole which moves in the opposite direction down the stack.

The initiation and termination of the stimulated emission process should now be considered. The initiation of the decay in a molecular ensemble can start at any point where an asymmetry occurs. This can involve either end of the stack.

Another event which can trigger the release of energy stored in the stack is the donation or acceptance of an electron, e.g., to remove one electron from, or add one electron to, the molecule on the end of the stack. The resulting charge imbalance can be sufficient to initiate a decay process. This type of decay implies that the decay begins along the end of the stack. The ends of the molecular stacks are typically terminated in electron donors or acceptors; however, the donors/receptors need not be located at the ends, but rather can be interspersed throughout the stacks. In some cases, the presence of impurities can perform the same function as the donor/receptor, i.e., prompting discharge.

The termination of the EPWASER decay process typically also occurs at one end of the molecular stack which makes up the ensemble. A final result of the release of stored energy by the stimulated emission mechanism is to produce either an energetic electron or a positively charged hole. The energetic electron can be one which is moved from a positively charged donor requiring a large energy step as discussed earlier. An alternative is that the energy is utilized by the positively charged hole to interact in a separate chemical process, such as the removal of an electron from a water molecule. The energy accumulated by the hole during the decay process can be applied to overcome the energy barrier to remove an electron from water.

Figure 12B:
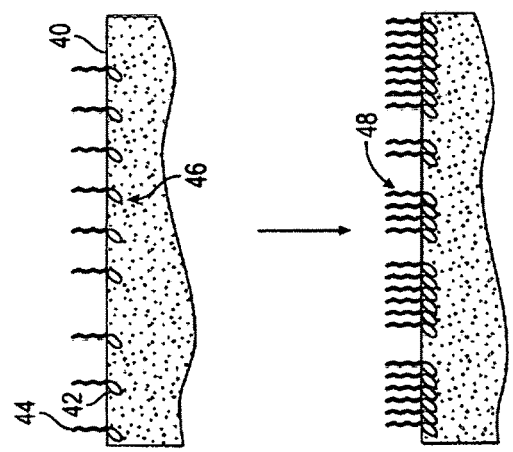
FIG. 12B is a schematic cross-section showing chlorophyll molecules on the surface of a polar solvent.
Figure 12A:
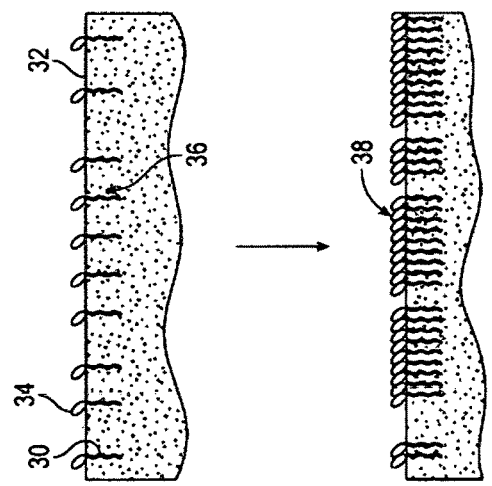
FIG. 12A is a schematic cross-section showing chlorophyll molecules on the surface of a non-polar solvent.
Figure 13:
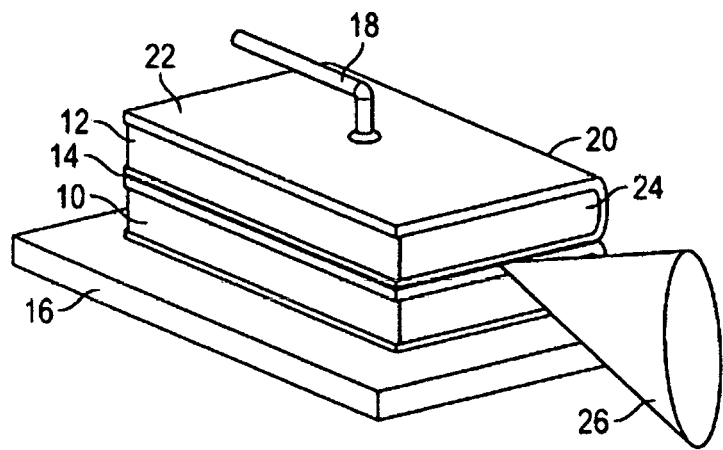
FIG. 13 is a perspective illustration of semiconductor device according to the present invention.

The first step in synthesizing an EPWASER device is a method of creating an ordered array of the selected molecules, for example, chlorophyll. One method of accomplishing this is to float the molecules, e.g., chlorophyll, in a surface monolayer on a non-polar liquid. An illustration of this is given in FIG. 12A. The hydrophobic tails 30 will be attracted to the polar liquid 32 and hydrophilic porphyrin heads 34 of the molecules will remain on the surface, with hydrophilic heads pointing upward and the tails pointing downward. The upper image shows the dissociated chlorophyll molecules 36 on the surface of the polar solvent.

If this surface monolayer is now cooled (and compressed if necessary), the chlorophyll molecules will tend to form associated aggregates undergoing a process similar to condensation in two dimensions. The formation of these molecule aggregates will cause the porphyrin heads of the chlorophyll molecules to link to closely associated linear stacks in the chloroplast structure. The number of molecules in each aggregate will be variable and will depend on the degree of nucleation of the two-dimensional crystals.

By dipping a microscope slide into the solution, it is possible to remove the molecular film intact from the surface. Depending upon whether the microscope slides are coated with a polar or non-polar material, it is possible to cover the slide with many layers of the molecular film by successive dippings or to have only one covering regardless of the number of dippings.

Another method of preparing the chlorophyll molecular film is to use a polar liquid 40 such as water which orients the hydrophilic heads 42 down and the tails 44 up. An example of this is drawn schematically in FIG. 12B. This type of film with dissociated molecules 46 could also be condensed into molecular aggregates in which closely associated chlorophyll molecules 48 are produced, as shown in the lower image.

Each of these methods has its own advantages. The first method has some advantages in getting porphyrin heads more closely associated than the tails. On the other hand, the second method seems to more clearly simulate the natural evolutionary process which may have taken place to form the primitive ancestors of early plants. Both methods of preparation, as well as various dipping procedures, are possible. For general guidance on carrying out the generation of these types of films, we incorporate by reference, each in its entirety, the following: I. a. S. V. Langmuir, *J. Amer. Chem. Soc.*, vol. 59, p. 2075, 1937.

Other methods of fabricating the ordered ensembles according to the invention can be employed to produce ensembles from varied types of materials and in various forms. For example, it is possible to fabricate a device according to the invention by employing solid state fabrication techniques. An embodiment of this type is described more fully below. In addition, it is also possible to employ nano-fabrication techniques in order to construct an ordered ensemble according to the invention.

The special features of electronic binding energy levels which have been described herein have been ascribed to the porphyrin ring rather than to chlorophyll itself. Thus, other compounds with similar porphyrin ring structures or other structures that satisfy the relationships described above are also capable of EPWASER action. There are likely many systems of conjugated bonds in molecules, preferably planar ring systems but not necessarily planar nor necessarily ring compounds, which possess the unique set of properties described above.

For example, one ring compound that can be used according to the invention is coronene, already discussed above.

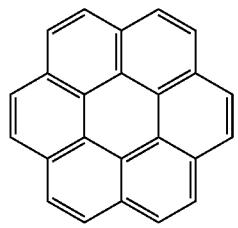 [SMILES: c1cc2ccc3ccc4ccc5ccc6ccc1c1c2c3c4c5c61]

Coronene (also known as superbenzene) is a polycyclic aromatic hydrocarbon (PAH) comprising six peri-fused benzene rings. Its chemical formula is $C_{24}H_{12}$. This aromatic compound can be described by 20 resonance structures or by a set of three mobile Clar sextets. In the Clar sextet case, the most stable structure for coronene has only the three isolated outer sextets as fully aromatic although super-aromaticity would still be possible when these sextets are able to migrate into the next ring. See also, phthalocyanine ($H_2Pc$), also discussed above.

Another suitable compound is one selected from the family of compounds known as hexa-benzopericoronenes, which are members of the coronene family.

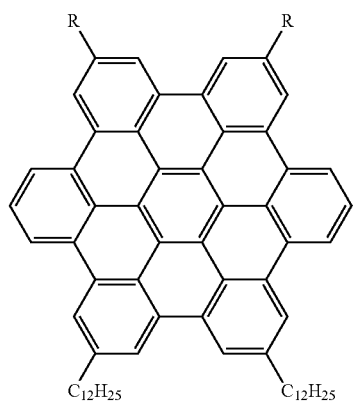

These compounds have been used in supramolecular electronics. They are known to self-assemble into a columnar phase. One derivative in particular forms carbon nanotubes, and the columnar phase in this compound further organizes itself into sheets, which ultimately roll up like a carpet to form multi-walled nanotubes with an outer diameter of 20 nanometers and a wall thickness of 3 nanometers. The nanotubes have sufficient length to fit between two platinum nanogap electrodes produced by scanning probe nanofabrication and are 180 nanometer apart.

In addition to chlorophyll-like rings of carbon atoms with a count that can be evenly divided by 4 and coronene and similar rings that behave as a ring of six linked entities that can be excited into higher energy states, it is possible to employ other compounds, such as, ruthenium tris bipyridine.

Some of the important characteristics of the EPWASER concept employed in the present invention are the following:

The mechanism of stimulated emission from the triplet state provides a means of storing the energy of four or more quanta and utilizing it simultaneously.

EPWASER energy storage by electron transfer is consistent with quantum mechanical predictions of the binding energies of the electrons in chlorophyll molecules.

Stimulated emission produces a large amplitude coherent electric field which contains the energy of multiple photons and may be employed in photochemistry, e.g., field ionization of water molecules.

The EPWASER process can involve as few as two molecules (a dimer) or an associated ensemble containing any number of molecules.

The release of the energy of the EPWASER mechanism produces an energetic electron-hole pair which is either involved in direct oxidation of another compound (e.g., water) or participates in transfer of charge from an electropositive donor.

Many applications are possible using the stimulated emission and EPWASER mechanisms, particularly in the field of energy conversion. Some of the preferred applications are now described, including an EPWASER photovoltaic device and the EPWASER photochemical decomposition of water to generate hydrogen and oxygen for use in a fuel cell. Other preferred applications are based on the similarities of achieving a lasing-like action with the EPWASER system, e.g., with chlorophyll and other preferred compounds. In other words, the EPWASER system is applicable to virtually all of the uses for which lasers are used.

One preferred application comprises a photovoltaic device consisting of molecular aggregates formed from chlorophyll films.

Since the electrons and holes which are produced by the EPWASER process have large energies they can be made to climb the potential barrier and a type of photovoltaic cell can be created using this mechanism. The energy of the charge carriers produced by the EPWASER depend on the number of molecules which are aligned in the linear stacks of the molecular ensembles. This in turn determines the voltage of the photovoltaic device. Electrons from an EPWASER whose molecular aggregates consist of dimers would be capable of passing current over a potential barrier which is equivalent to the energy of two light quanta (~2×1.8 eV). Endergonic reactions may be considered to be those that require added energy greater than one photon of visible light. In some instances the amount of energy required for a chemical reaction exceeds that which can be practically produced by thermal input from heating the reactants. It is a particular advantage of the present invention that the EPWASER mechanism is capable of supplying relatively high levels of energy, including very high levels of energy, e.g., needed for the fixing of nitrogen to produce ammonia.

If the molecular ensemble consists of linear stacks with a larger number of molecules, the energy of the charge carriers is proportionally increased. There is a practical limit to the size of this voltage because, at high voltages, breakdown within the film or leakage currents will neutralize the output power. In air, the limit is about 1.5 mm between conducting paths to remove the power. In pure water it is much larger, and in water with some salts, the limit must be determined in-situ. The limits in impure water depend on the level of salinity in the water. In a controlled non-aqueous environment, e.g., a vacuum, voltage breakdown limits go up to approximately $10^4$ or $10^5$ volts/cm.

Figure 14:
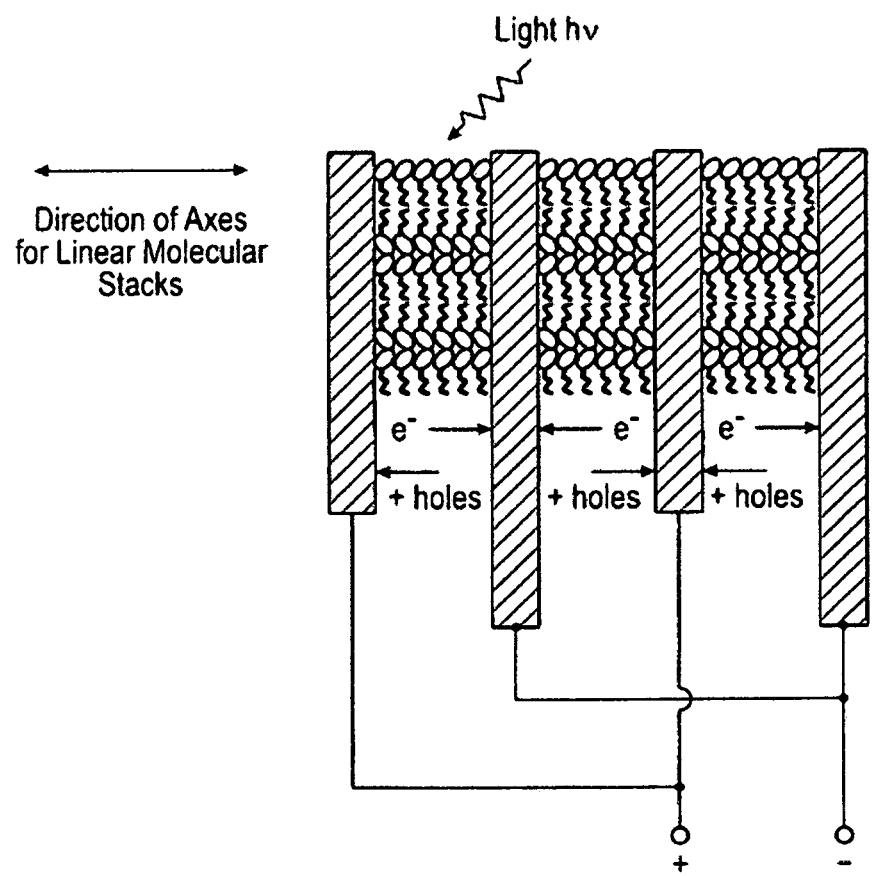
FIG. 14 is a schematic drawing of photovoltaic device using the EPWASER system.

To construct such a device there are first created the associated molecular ensembles and then they are arranged a conducting substrate which contacts the terminations of the linear stacks of the molecular arrays. A schematic of this arrangement is shown in FIG. 14.

Successful achievement of EPWASER action is part of the process to accomplish water-splitting for production of fuel from sunlight. Operation of stimulated emission in molecular aggregates provides the ability to collect and apply the light energy to move electric charges.

In order to dissociate the water, $H_2O$ molecules must be in contact with one end of the molecular stack and an electron transfer mechanism must be at the other end. In a preferred arrangement, a chemical structure containing a transition metal, preferably, manganese is utilized to provide a contact with $H_2O$, i.e., an intermediary between the stack and the chemical reactant(s). Most preferably, the transition metal is in the form of a manganese ions that also serve to complex with the water and to stabilize the reactive intermediates s the water is split. However, the preferred manganese complex is generally not necessary since a molecular aggregate of chlorophyll can directly remove electrons from water. The use of a transitional metal in the contact site is entirely optional, as natural contact sites typically exist in the ensemble structures themselves.

Figure 15:
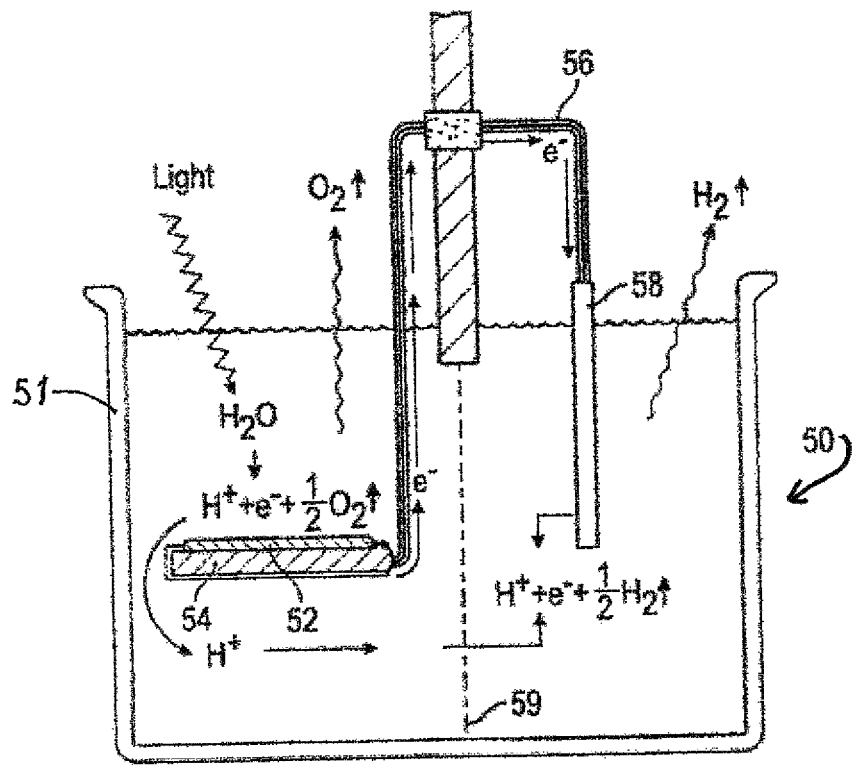
FIG. 15 is a schematic illustration of a photochemical decomposition system for converting water into hydrogen and oxygen.

Providing electron transport from the other end of a linear stack which makes up the molecular aggregate can be accomplished in one embodiment by connection to an electrical circuit in a "galvanic cell" 50 as depicted in FIG. 15. The process occurs as follows. Light acts on a layer of associated chlorophyll aggregates 52 immersed on one side of the cell to produce the stimulated emission process. This layer of molecular ensembles 52 is the EPWASER medium which transfers electrons from the water contained in containment vessel 51 of cell 50 to the conducting substrate 54.

The outside of the metal substrate must be insulated so that electron flow from the substrate is conducted up a wire 56 which is also insulated. The other end of the wire is connected to an uninsulated electrode 58 immersed for transfer of electrons to H+ ions on the other side of the galvanic cell which is delineated by membrane 59 and is in the dark.

The two halves of the cell are separated by a membrane 59 which is permeable to H+ ions. The H+ ions produced on the light side drift through the membrane and combine with electrons on the other side to produce hydrogen gas. In this way oxygen is evolved on one side of the cell and hydrogen on the other side.

Figure 16A:
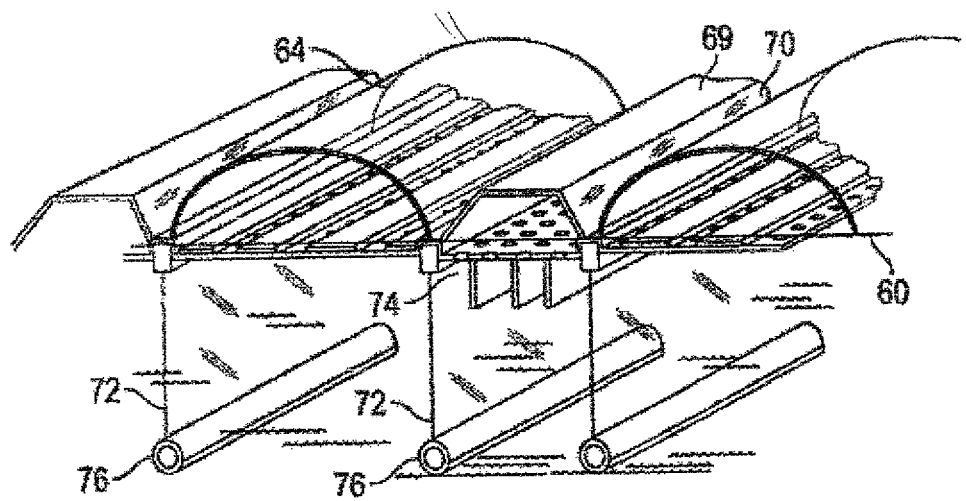
FIG. 16A is a perspective view of a floating solar conversion plant for water decomposition.
Figure 16B:
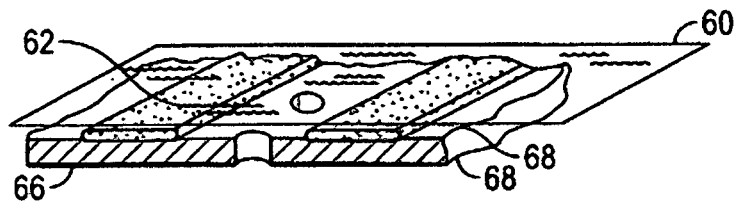
FIG. 16B is a perspective view of the detail of the photoactive surface in the system of FIG. 16A.

Large scale photochemical conversion of solar energy can be accomplished in one embodiment as follows, with reference to FIGS. 16A and 16B. Flexible structures are fabricated which are photochemical converters, as described above, and these membranes are then floated over the surface of a body of water 60. The photoactive part of the structure 62 would cover a large area in order to intercept a large amount of solar energy and is mounted on a conducting substrate 66, which is otherwise covered by insulating layers 68. The covering 64 of the photoactive surface must also be transparent to light or have areas which are open for light passage. One side of the photoactive surface must be in contact with the water.

It is also necessary to have some means to collect the hydrogen and oxygen which are produced. The oxygen is evolved as a gas above the photoactive surface and is collected in a flexible transparent cover 64 which inflates as the gas builds up. The gas collection system has at least two compartments to separate the hydrogen and the oxygen. The hydrogen collector compartments 69 are preferably opaque to light. A drawing of this type of apparatus is shown in FIGS. 16A and 16B.

Electrons are separated from water by the EPWASER process in the photoactive layers of chlorophyll aggregates. Oxygen is liberated at these surfaces and collected under the flexible transparent covering 64. The electrons are collected by the substrate under the photoactive surface and conducted to exposed hydrogen electrodes in the adjacent compartments. Protons from decomposed $H_2O$ flow through the permeable membranes 72 which separate the compartments to combine with electrons at the hydrogen electrodes 74. This produces hydrogen gas which is collected in a compartment 69 with an opaque covering. The sloping sides 70 of the cover of the hydrogen compartment 69 are preferably "mirrored" to provide better light utilization.

The structure is articulated at each joint between compartments. The proper water level is maintained by controlling the amount of ballast in tubes 76 which are at bottoms of the permeable membranes 72. The oxygen collecting volumes are covered by the transparent films which are closed at one end and connected to piping manifolds at the opposite end. A similar type of manifold arrangement gathers the hydrogen which is produced.

Figure 17A:
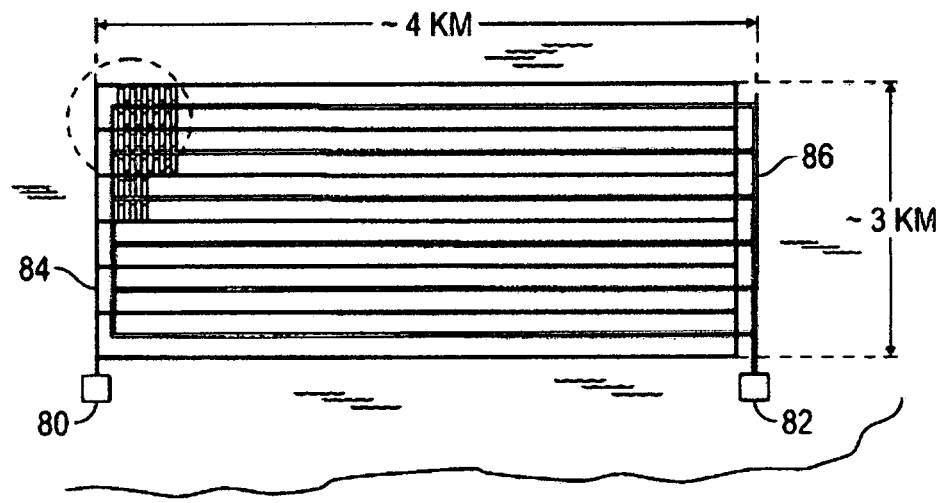
FIG. 17A is a schematic plan view of a large scale floating photochemical plant.
Figure 17B:
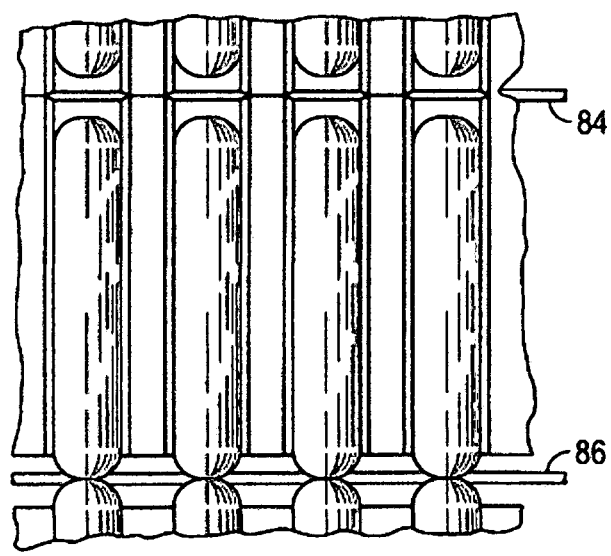
FIG. 17B is an enlarged view showing the detail of the portion in the circle in FIG. 17A.

Multiple units of this type can be spread over the surface of the water to convert solar energy on a large scale. A layout of a large scale photochemical plant is shown in FIGS. 17A and 17B, which is a detailed view of the portion circled in FIG. 17A. The plant is shown with separate hydrogen storage vessel 80 and oxygen storage vessel 82, as well as separate hydrogen pipes 84 and oxygen pipes 86.

A relatively large area must be covered to provide power for a significant size installation. An estimate of the required area can be obtained as follows. A typical size electric power plant (1000 MWe) requires an input of 3000 MWe at ~30% efficiency. This in turn requires a photoactive area of $3 \times 10^6$ m$^2$ exposed to solar flux. Furthermore, this is adequate only at peak solar flux. For base load operation, averaging the insolation over day and night and the seasons approximately increases the amount of required area by a factor of 4 to $12 \times 10^6$ m$^2$ (e.g., a 3 km$\times$4 km rectangle).

This large area requirement gives strong motivation to consider systems which are floating over a large body of water such as the ocean. Such an off-shore plant is more practical than consuming usable land area on the earth's surface. Since the products of a photochemical plant are hydrogen and oxygen which are both storable and shippable, the advantages of a land-based system seem to be rather small. In fact, a photochemical plant located at sea has attractive features which would not be available with an off-shore electric plant, because the electric plant requires a costly transmission line back to the shore.

In addition to the production of hydrogen and oxygen, stimulated emission photochemistry has many other applications. Any endergonic chemical reaction which is difficult to accomplish because it requires a large energy step is a candidate-for the stimulated emission process. The EPWASER mechanism allows an aggregate of any number of molecules to add photon quanta and build up very energetic charge carriers. Thus, chemical reactions which require redox potentials of many volts are possible. These chemical reactions can be used for the production of special materials requiring large redox potentials at low temperature for formation. Other possible uses are information storage, imaging, or new types of photography.

As mentioned before, many other organic ring compounds, with conjugated double bonds in the ring (any ring of 4, 8, 12, 16, 20, etc. atomic sites) can be used as an EPWASER medium. The complete list of applications for a successful EPWASER process is expected to be as large as have been developed for lasers.

Preferred applications of the present device and/or process comprise:

applying the energy release to a chemical reaction, more preferably a reaction comprising splitting water molecules into hydrogen and oxygen. In this and other preferred aspects of the invention, the application of the energy release is preferably to a photochemical process, which requires energy steps greater than the energy contained in one photon of light;

conversion of photovoltaic energy;

applying currents caused by charge transfer for modulating signals in circuits employed for communication, wherein the communication circuits comprise an optical fiber, an electric conductor, or a radio transmission system;

utilizing the released energy stimulated from the stored energy to imprint a pattern to store information content;

storing the information is stored directly in the excited energy states of the atomic or molecular units of the ensemble, whereby some selected units in a chain are pumped to store excited electrons, while other selected units remain in their lower energy states in such a way that the pattern of excited vs. de-excited units becomes a form of encoded information. A method of retrieving the encoded information from such a device comprises reading the variations of current that would be produced when the information ensemble releases its stored energy by producing a modulated transport through the chain of selectively pumped and de-excited units;

transmission of electrical power using light photons; and to make an accelerator on a chip, wherein the ordered ensemble comprises a large number of atomic or molecular units are aligned in such a way that it can build up a very high energy in the electrons transported down the chain in order to project a beam of electrons out of the end, thereby creating a very tiny linear accelerator.

What is claimed is:

1. A method for carrying out a chemical reaction, comprising:
    conducting an endergonic chemical reaction that comprises a reaction that requires an amount of energy greater than one photon of visible light; and
    supplying to the chemical reaction energy comprising an electron polarization wave produced by a process comprising:
    (A) pumping energy into a bounded volume of excitable medium containing a fabricated and ordered ensemble of a material comprised of closely spaced molecules of a ring compound, wherein the ordered ensemble has (a) well defined energy states including a lower state, and one or more higher states above the lower state, and (b) a property represented by a curve of total electron binding energy versus a number of electrons added to one of the closely spaced molecules that is flat enough to enable an electron to be added to or subtracted from the molecule with a negligible change in total binding energy in the molecule; and (c) wherein the closely spaced molecules of the ring compound are arranged sufficiently close together to enable transfer of excited electrons between adjacent closely spaced molecules due to the property of the closely spaced molecules recited in (b), whereby an excited electron can be transferred between adjacent closely spaced molecules with a negligible change in binding energy, to form a longer-lived excited state because the excited electron is spin-forbidden to decay back to the lower state within the one of the closely spaced molecules to which it has moved, wherein energy is pumped in an amount that is sufficient to raise a plurality of electrons in the closely spaced molecules to the one or more higher energy states;
    (B) releasing stored energy in the longer-lived excited state, by a transition process that includes a charge transfer jumping from the longer-lived excited state in one molecule to the lower state in the one of the adjacent closely spaced molecules, to thereby produce an electromagnetic oscillation; and
    (C) stimulating an output emission from the bounded volume of excitable medium by employing the electromagnetic oscillation to stimulate at least one additional successive transition of a second excited electron to release its energy of excitation by jumping to a neighboring molecule, thereby amplifying the electromagnetic oscillation with energy output, to thereby sum up a plurality of individual excitations adding to an amplitude of the stimulating electromagnetic oscillation, to create an output emission comprising the electron polarization wave that includes an energetically driven charge motion of electrons and/or holes.

2. A method as claimed in claim 1, wherein the pumping energy is directed onto the excitable medium in an amount sufficient to produce a localized, population inversion, wherein the number of molecules in the one or more higher energy states is greater than the number of molecules in the lower energy state.

3. A method as claimed in claim 1, wherein the ordered ensemble o molecules consists essentially of a single species of molecule.

4. A method as claimed in claim 1, wherein the ordered ensemble includes a layer having a thickness dimension and a longitudinal axis running transverse to the thickness dimension, and wherein the electron polarization wave moves in the direction of the longitudinal axis.

5. A method as claimed in claim 1, wherein at least a portion of the output is generated within the excitable medium containing the fabricated and ordered ensemble of the material by amplifying the electron polarization wave with energy output that adds coherently to the amplitude of the electromagnetic oscillation and adds energy to the energetically driven charge motion of the electrons and/or holes.

6. A method as claimed in claim 1, wherein the ordered ensemble of molecules comprises coronene.

7. A method as claimed in claim 1, wherein the ring compound comprises a member of the coronene family in crystalline form.

8. A method as claimed in claim 1, wherein the ring compound comprises chlorophyll rings of carbon atoms.

9. A method as claimed in claim 4, wherein the layer comprises a linear stack of molecules of the ring compound in the direction of the longitudinal axis of the layer.

10. A method as claimed in claim, wherein the ring compound comprises conjugated rings in planar molecules.

11. A method as claimed in claim 1, wherein the ordered ensemble comprises at least one dimer of the ring compound.

12. A method as claimed in claim 1, wherein the chemical reaction comprises splitting water molecules into hydrogen and oxygen.

13. A method as claimed in claim 1, wherein the ring compound comprises chlorophyll rings of carbon atoms, coronene and rings that behave as a ring of six linked entities that can be excited into higher energy states, or ruthenium tris bipyridine.

14. A method as claimed in claim 1, wherein the ring compound comprises phthalocyanine.

15. A device for carrying out a chemical reaction utilizing an Electron Polarization Wave Amplified by Stimulated Emission of Radiation (EPWASER), comprising:
    an amount of at least one reactant and for conducting an endergonic chemical reaction; and
    an EPWASER medium for supplying, to the chemical reaction, energy in the form of an output emission comprising an electron polarization wave that includes an energetically driven charge motion of electrons and/or holes, said EPWASER medium comprising
    a bounded volume of excitable medium containing a fabricated and ordered ensemble of a material comprised of closely spaced molecules of a ring compound arranged in at least one linear stack of molecules, wherein the ordered ensemble has (a) well defined energy states including a lower state, and one or more higher states above the lower state, and (b) a property represented by a curve of total electron binding energy versus a number of electrons added to one of the closely spaced molecules that has a portion that is flat enough to enable an electron to be added to or subtracted from the molecule with a negligible change in total binding energy in, the molecule; and (c) wherein the closely spaced molecules of the ring compound are arranged sufficiently close together to enable transfer of excited electrons between adjacent closely spaced molecules due to the property of the closely spaced molecules recited in (b), whereby an excited electron can be transferred between adjacent closely spaced, molecules with a negligible change in binding energy, to form a longer-lived excited state because the excited electron is spin-forbidden to decay back to the lower state within the one of the closely spaced molecules to which it has moved;
    means for pumping energy into the bounded volume of excitable medium in an amount that is sufficient to raise a plurality of electrons in the closely spaced molecules to the one or more higher energy states to store energy in the longer-lived excited state, and that is sufficient to cause a localized population inversion, whereby energy stored in the longer-lived excited state is released by a transition process that includes a charge transfer jumping from the longer-lived excited state in one molecule to the lower state in the one of the adjacent closely spaced molecule, to thereby produce an electromagnetic oscillation; and
    means, employing the electromagnetic oscillation, for stimulating from the bounded volume of excitable medium said output emission, said output emission stimulating means employing the electromagnetic oscillation to stimulate at least one additional successive transition of a second excited electron to release its energy of excitation by jumping to a neighboring molecule, thereby amplifying the electromagnetic oscillation with energy output, to thereby sum up a plurality of individual excitations adding to an amplitude of the stimulating electromagnetic oscillation, to create said output emission comprising the electron polarization wave that includes an energetically driven charge motion of electrons and/or holes moving along the molecular stack.

16. A device as claimed in claim 15, wherein the ring compound comprises chlorophyll rings of carbon atoms, coronene and rings that behave as a ring of six linked entities that can be excited into higher energy states, or ruthenium tris bipyridine.

17. A device for carrying out a chemical reaction utilizing an Electron Polarization Wave Amplified by Stimulated Emission of Radiation (EPWASER), comprising:
    an amount of at least one reactant for conducting an endergonic chemical reaction; and
    an EPWASER medium for supplying, to the chemical reaction, energy in the form of an output emission comprising an electron polarization wave that includes an energetically driven charge motion of electrons and/or holes, said EPWASER medium comprising a bounded volume of excitable medium containing a fabricated and ordered ensemble of a material comprised of closely spaced molecules of a ring compound arranged in at least one linear stack of molecules, wherein the ordered ensemble has (a) well defined energy states including a lower state, and one or more higher states above the lower state, and (b) a property represented by a curve of total electron binding energy versus a number of electrons added to one of the closely spaced molecules that has a portion that, is flat enough to enable an electron to be added to or subtracted from the molecule with a negligible change in total binding energy in the molecule; and (c) wherein the closely spaced molecules of the ring compound are arranged sufficiently close together to enable transfer of excited electrons between adjacent closely spaced molecules due to the property of the closely spaced molecules recited in (b), whereby an excited electron can be transferred between adjacent closely spaced molecules with a negligible change in binding energy, to form a longer-lived excited state because the excited electron is spin-forbidden to decay back to the lower state within the one of the closely spaced molecules to which it has moved;

means for pumping energy into the bounded volume of excitable medium in an amount that is sufficient to raise a plurality of electrons in the closely spaced molecules to the one or more higher energy states to store energy in the longer-lived excited state, and that is sufficient to cause a localized population inversion, whereby energy stored in the, longer-lived excited state is released by a transition process that includes a charge transfer jumping from the longer-lived excited state in one molecule to the lower state in the one of the adjacent closely spaced molecule, to thereby produce an electromagnetic oscillation; and means, employing the electromagnetic oscillation, for stimulating from the bounded volume of excitable medium said output emission, said output emission stimulating means employing the electromagnetic oscillation to stimulate at least one additional successive transition of a second excited electron to release its energy of excitation by jumping to a neighboring molecule, thereby amplifying the electromagnetic oscillation with energy output, to thereby sum up a plurality of individual excitations adding to an amplitude of the stimulating electromagnetic oscillation, to create said output emission comprising the electron polarization wave that includes an energetically driven charge motion of electrons and/or holes moving along the molecular stack, wherein the ring compound comprises phthalocyanine.

18. A device as claimed in claim 15, wherein the ordered ensemble includes a layer having a thickness dimension and a longitudinal axis running transverse to the thickness dimension, and wherein the electron polarization wave moves in the direction of the longitudinal axis along said molecular stack.

19. A device as claimed in claim 18, wherein the linear stack of molecules contains an intermediary arrangement for removing amplified energy from the molecular stack, the intermediary arrangement comprising a docking site interface that provides contact with the chemical reactant.

20. A device as claimed in claim 15, wherein the device comprises a cell, the at least one reactant comprises water, and the chemical reaction comprises splitting water molecules into hydrogen and oxygen.

21. A device as claimed in claim 15, wherein the ordered ensemble comprises at least one dimer of the ring compound.

22. A device as claimed in claim 15, wherein said output emission stimulating means employs the electromagnetic oscillation to stimulate at least one additional successive transition of a second excited electron to release its energy of excitation to amplify the electron polarization wave with energy output in a manner that adds coherently to the amplitude of the electromagnetic oscillation.

23. A device as claimed in claim 15, wherein the ordered ensemble of molecules comprises coronene.

* * * * *